United States Patent
Tarutani et al.

(10) Patent No.: US 6,486,756 B2
(45) Date of Patent: Nov. 26, 2002

(54) SUPERCONDUCTOR SIGNAL AMPLIFIER

(75) Inventors: Yoshinobu Tarutani, Kokubunji (JP); Kazuo Saitoh, Kodaira (JP); Kazumasa Takagi, Hinode (JP); Yoshihisa Soutome, Kokubunji (JP); Tokuumi Fukazawa, Tachikawa (JP); Akira Tsukamoto, Toda (JP)

(73) Assignees: Hitachi, Ltd., Tokyo (JP); International Superconductivity Technology Center, Tokyo (JP)

( * ) Notice: Subject to any disclaimer, the term of this patent is extended or adjusted under 35 U.S.C. 154(b) by 30 days.

(21) Appl. No.: 09/816,240

(22) Filed: Mar. 26, 2001

(65) Prior Publication Data

US 2001/0025012 A1 Sep. 27, 2001

(30) Foreign Application Priority Data

Mar. 27, 2000 (JP) .......................................... 2000-090734
Mar. 27, 2000 (JP) .......................................... 2000-090735

(51) Int. Cl.⁷ ............................................... H03F 17/00
(52) U.S. Cl. .................... 333/995; 505/202; 505/193; 330/124 R; 330/54; 326/3
(58) Field of Search ........................ 326/1–7; 333/995; 330/124 R, 54; 505/202, 193

(56) References Cited

U.S. PATENT DOCUMENTS 5,479,131 A * 12/1995 Lee .............................. 327/367
6,229,332 B1 * 5/2001 Herr .............................. 326/1
6,242,939 B1 * 6/2001 Nagasawa et al. ............. 326/3

FOREIGN PATENT DOCUMENTS

JP 8-236824 9/1996

OTHER PUBLICATIONS

O.A. Mukhanov et al, "Josephson Output Interface for RSFQ Circuits", IEEE Transactions on Applied Superconductivity, vol. 7, No. 2, Jun. 1997, pp. 2826–2831.

S. Polonsky et al, "Toward Broadband Communications Between RSFQ Circuits", IEEE Transactions on Applied Superconductivity, vol. 7, No. 2, Jun. 1997, pp. 2818–2821.

* cited by examiner

*Primary Examiner*—Don Phu Le
(74) *Attorney, Agent, or Firm*—Mattingly, Stanger & Malur, P.C.

(57) ABSTRACT

A superconductor signal amplifier which receives an extremely small high-frequency signal having a frequency of tens of GHz generated in a superconductive circuit, amplifies the voltage of the high-frequency signal without a decrease in frequency, and outputs the thus amplified high-frequency signal from the superconductive circuit. At an output part of a single flux quantum circuit using a flux quantum as a binary information carrier, there are provided a superconductive junction line for flux quantum transmission and a splitter for simultaneously producing two flux quanta from a flux quantum. According to the number of plural series-connected SQUIDs, a plurality of flux quantum signals are generated and input to the plural series-connected SQUIDs so that the SQUIDs are simultaneously switched to a voltage state. In each SQUID pair comprising two SQUIDs, a part of an inductor is shared by the two SQUIDs for reduction in inductance, thereby increasing an output voltage of the series-connected SQUIDs. Furthermore, a magnetic shielding film formed under each SQUID is electrically isolated from ground to prevent a signal delay due to a parasitic capacitance.

18 Claims, 23 Drawing Sheets

SUPERCONDUCTOR SIGNAL AMPLIFIER

BACKGROUND OF THE INVENTION

1. Field of the Invention

The present invention relates to a superconductive electronic device which provides ultrafast switching performance in a high-speed digital or analog data processing circuits, and more particularly to a configuration of a superconductor signal amplifier required for a superconductive circuit using flux quanta as binary information carriers.

2. Description of the Related Art

A superconductive single flux quantum (SFQ) circuit, in which an SFQ is used as an information carrier, i.e., the presence/absence of an SFQ is used to represent binary "1" or "0", is an extremely high-speed circuit capable of transmitting signals having a width of the order of picoseconds at a frequency exceeding 100 GHz. Considerable research has been performed on SFQ circuit applications to realize an analog-digital converter circuit, digital logic circuit, or the like that has ultrafast operational performance. A signal amplitude in the SFQ circuit, however, is so extremely small that an output voltage as low as 1 mV or less is attainable. Although such a low signal level is advantageous in that power consumption and heat generation are low in circuit operation, connections to common semiconductor circuits such as CMOS and ECL are required in practical use of the SFQ circuit, and it is therefore necessary to amplify an output voltage of the SFQ circuit up to an operating voltage level of each circuit which receives an output signal from the SFQ circuit. Moreover, where electrical wiring is provided from the SFQ circuit placed in a cryogenic container to a circuit in a room-temperature environment, an output signal is liable to attenuation due to necessity of relatively long wiring arrangement. From this point of view, it is also necessary to provide a signal amplifier circuit at an output part of the SFQ circuit.

Conventional superconductor signal amplifier circuits are classified into the following two types; a signal amplifier in which series-connected Josephson junctions are simultaneously switched to a voltage state, and a signal amplifier which uses a superconducting quantum interference device (SQUID). The SQUID is a superconductive device comprising two Josephson junctions disposed in a closed loop formed of a superconductive wiring material, a bias current input terminal disposed between the two Josephson junctions, and a ground terminal disposed on the opposite side thereof, wherein a large change in voltage is produced across the two terminals by applying extremely small variation in magnetic field.

An example of a circuit for amplifying a very-high-speed signal through the use of SQUIDs has been proposed by O. A. Mukhanov et al. in IEEE TRANSACTIONS ON APPLIED SUPERCONDUCTIVITY, VOL. 7, p. 2826, FIG. 1, 1997. In this example, a Josephson transmission line is so arranged that a flux quantum signal is split into a plurality of flux quantum signals while maintaining a pulse signal characteristic thereof, and each of the plural flux quantum signals is input to a control line for applying a magnetic field to each of a plurality of series-connected SQUIDs disposed in an array. On the Josephson transmission line, two or more Josephson junctions are parallel-connected using superconductive wiring, and the one end thereof is connected to ground and the other end thereof is connected to a bias source for flux quantum signal propagation through the superconductive wiring. On input of a flux quantum signal, the Josephson junctions are switched in succession so that the flux quantum signal propagates while reshaping a pulse waveform thereof.

In the above arrangement in which the splitting of a flux quantum signal is made, the control line for applying a magnetic field to SQUID has a length shorter than that in a single-control-line routing arrangement, thereby reducing a signal delay which is proportional to the inductance of the control line. Thus, an 8 GHz signal is amplified to 2 mV.

Another example of a circuit using SQUIDS, though intended for a different purpose, has been reported by S. Polonsky et al. in IEEE TRANSACTIONS ON APPLIED SUPERCONDUCTIVITY, VOL. 7, p. 2818, 1997. In signal transfer between superconductive chips, it is required to avoid impedance mismatching due to propagation through wiring between the chips on a substrate. For this purpose, the above-noted circuit is designed to convert a single flux quantum signal into four multi-flux quantum signals. In the same report (FIG. 3), there is disclosed a circuit scheme in which splitters are cascaded to perform simultaneous switching of SQUIDs.

SUMMARY OF THE INVENTION

It is an object of the present invention to provide a superconductor signal amplifier for amplifying a flux quantum signal having a frequency of tens or hundreds of GHz from a single flux quantum circuit. More specifically, the present invention provides a superconductor signal amplifier which is capable of performing sufficient amplification while maintaining high speed and enhancing responsivity to an input signal.

In carrying out the present invention and according to one aspect thereof, there is provided a superconductor signal amplifier circuit comprising a plurality of series-connected SQUIDs (superconducting quantum interference devices), in which flux quantum signals, each maintaining a pulse characteristic, are input simultaneously to a control line for applying a magnetic field to each of the SQUIDs so that magnetic coupling is made on the SQUIDs, thereby simultaneously switching the SQUIDs to a voltage state. To be more specific, there is provided a superconducting quantum interference device comprising: a first Josephson junction pair made of two Josephson junctions; first and second inductive elements connected to the first Josephson junction pair in a loop configuration to form a first superconductive loop; a second Josephson junction pair made of two Josephson junctions connected in a loop configuration for sharing a part of the second inductive element to form a second superconductive loop; a third inductive element connected to the second Josephson junction pair in a loop configuration on the second superconductive loop; and an input circuit magnetically coupled with the first and third inductive elements.

Further, according to another aspect of the present invention, there is provided a superconductive circuit comprising: a first Josephson transmission line including; an inductive element having an input terminal for signal input and an output terminal for signal output, Josephson junctions respectively connected to the input and output terminals of the inductive element, and direct current sources respectively connected to the input and output terminals of the inductive element; a second Josephson transmission line which is identical in structure to the first Josephson transmission line; a fourth inductive element connected between an input terminal of the second Josephson transmission line and an output terminal of the first Josephson transmission line; a first inductive element magnetically coupled with the fourth inductive element; a Josephson junction pair made of two Josephson junctions; a first superconductive loop connected to the Josephson junction pair and the forth inductive element in a loop configuration; and a resistor element connected to an output terminal of the second Josephson transmission line.

Still further, according to another aspect of the present invention, there is provided a superconductive circuit comprising: a plurality of superconductive circuits each including; a substrate, a magnetic shielding film formed on the substrate, a first insulating film for electrical insulation on the magnetic shielding film, a first superconductive thin film formed on the first insulating film, a second insulating film formed on the first superconductive thin film, a second superconductive thin film formed on the second insulating film, and a Josephson junction formed by connecting the first superconductive thin film with the second superconductive thin film; wherein the magnetic shielding film is patterned to provide isolation for each of the plural superconductive circuits.

Furthermore, according to a packaging arrangement of the present invention, there is provided a superconductive circuit comprising: a superconductive circuit including; a substrate, a magnetic shielding film formed on the substrate, a first insulating film for electrical insulation on the magnetic shielding film, a first superconductive thin film formed on the first insulating film, a second insulating film formed on the first superconductive thin film, a second superconductive thin film formed on the second insulating film, and a Josephson junction formed by connecting the first superconductive thin film with the second superconductive thin film; and two superconductive thin films magnetically coupled with the superconductive circuit.

Moreover, according to another aspect of the present invention, there is provided a superconductive circuit comprising: a plurality of superconductive circuits each including; a substrate, a magnetic shielding film formed on the substrate, a first insulating film for electrical insulation on the magnetic shielding film, a first superconductive thin film formed on the first insulating film, a second insulating film formed on the first superconductive thin film, a second superconductive thin film formed on the second insulating film, and a Josephson junction formed by connecting the first superconductive thin film with the second superconductive thin film; and two superconductive thin films magnetically coupled with the plural superconductive circuits respectively; wherein the magnetic shielding film is patterned to provide isolation for each of the plural superconductive circuits.

Still further, according to a low-noise circuit system scheme of the present invention, there is provided a superconductive circuit device comprising: a first Josephson transmission line including; a first Josephson junction pair made of two Josephson junctions, first and second inductive elements connected to the first Josephson junction pair in a loop configuration to form a first superconductive loop, a second Josephson junction pair made of two Josephson junctions connected in a loop configuration for sharing the second inductive element to form a second superconductive loop, a third inductive element connected to the second Josephson junction pair in a loop configuration on the second superconductive loop, an inductive element having an input terminal for signal input and an output terminal for signal output, Josephson junctions respectively connected to the input and output terminals of the inductive element, and direct current sources respectively connected to the input and output terminals of the inductive element; a second Josephson transmission line which is identical in structure to the first Josephson transmission line; a fourth inductive element which is connected to an input terminal of the first Josephson transmission line and magnetically coupled with the first inductive element; a fifth inductive element which is connected to an input terminal of the second Josephson transmission line and magnetically coupled with the third inductive element; a first terminal resistor disposed at an output terminal of the first Josephson transmission line; and a second terminal resistor disposed at an output terminal of the second Josephson transmission line.

Still further, according to a scheme for attaining a high amplification factor on simultaneous signal input in the present invention, there is provided a superconductive circuit comprising: a first Josephson transmission line including; a first Josephson junction pair made of two Josephson junctions, first and second inductive elements connected to the first Josephson junction pair in a loop configuration to form a first superconductive loop, a second Josephson junction pair made of two Josephson junctions connected in a loop configuration for sharing the second inductive element to form a second superconductive loop, a third inductive element connected to the second Josephson junction pair in a loop configuration on the second superconductive loop, an inductive element having an input terminal for signal input and an output terminal for signal output, Josephson junctions respectively connected to the input and output terminals of the inductive element, and direct current sources respectively connected to the input and output terminals of the inductive element; a second Josephson transmission line which is identical in structure to the first Josephson transmission line; a fourth inductive element which is connected to an output terminal of the first Josephson transmission line and magnetically coupled with the first inductive element; a fifth inductive element which is connected to an output terminal of the second Josephson transmission line and magnetically coupled with the third inductive element; a sixth inductive element connected to an input terminal of the first Josephson transmission line; a seventh inductive element connected to an input terminal of the second Josephson transmission line; and a signal input terminal connected to a terminal of the sixth inductive element and to a terminal of the seventh inductive element.

The above and other objects, features and advantages of the present invention will become more apparent from the following detailed description with reference to the accompanying drawings.

DETAILED DESCRIPTION OF THE PREFERRED EMBODIMENTS

Figure 1:
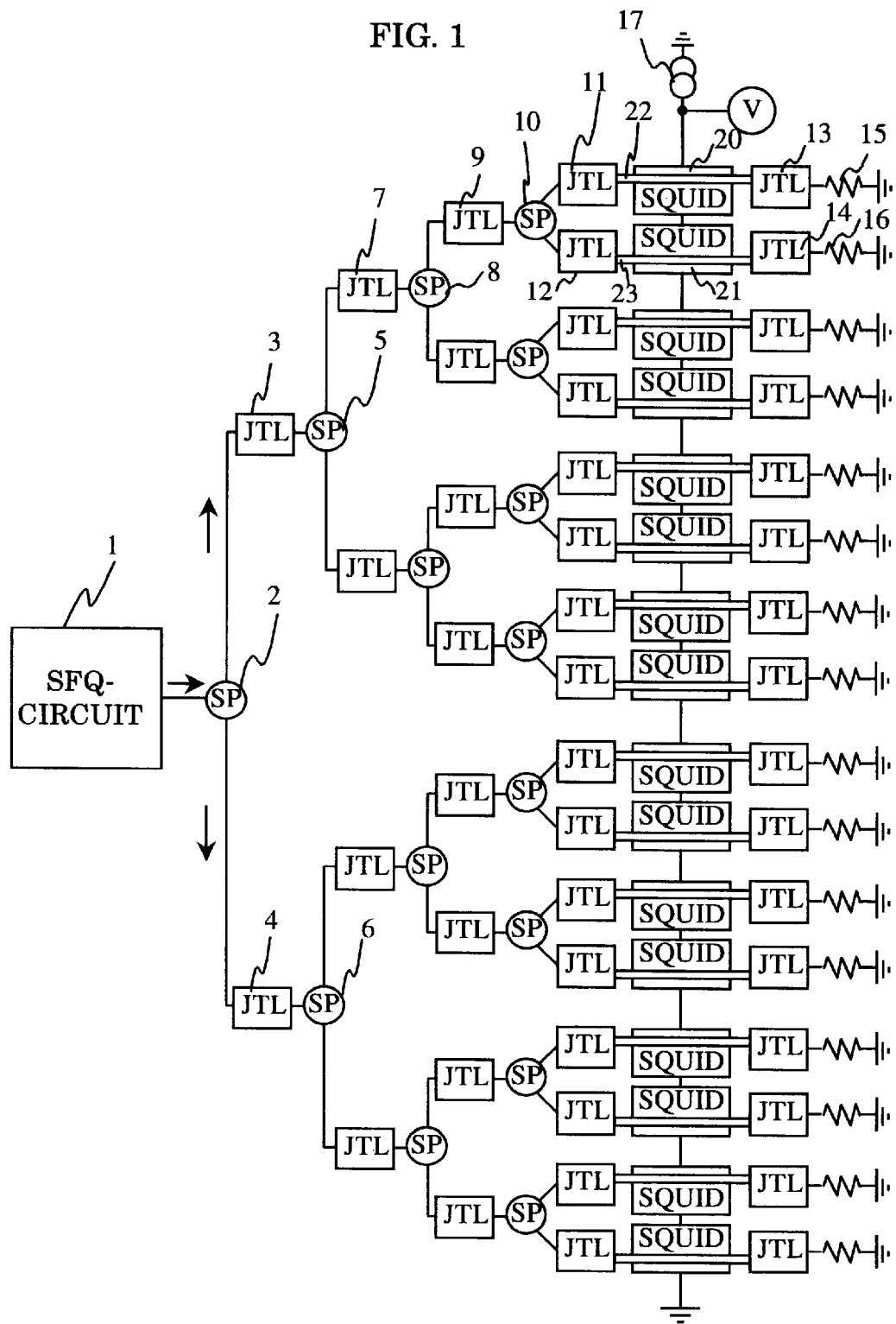
FIG. 1 is a schematic diagram showing a first preferred embodiment of the present invention.

For enhancement in amplification, which is a first object of the present invention, the flux sensitivity of each SQUID to a flux quantum is increased. For increasing the flux sensitivity of each SQUID, the inductance of an inductor forming a SQUID superconductive closed loop is decreased, and a longer distance of coupling between a control line for applying magnetic field and each SQUID inductor is provided in a structural arrangement in which a part of an inductor is shared by two SQUIDs. In Japanese Unexamined Patent Publication No. H8 (1996)-236824, there is also disclosed a structural arrangement in which a part of an inductor is shared by two SQUIDs for the purpose of enhancement in magnetic field detection sensitivity. In an example demonstrated in this patent publication, an input signal is magnetically coupled with a shared inductor. By way of contrast, in the present invention, two flux quantum signals having a constant magnitude are magnetically coupled with two SQUIDs, i.e., magnetic coupling is provided using a non-shared inductor part as an input inductor.

Where each SQUID provides high sensitivity, it is possible to shorten a coupling distance between a control line for applying magnetic field and a SQUID input inductor, i.e. to decrease the inductance of the control line for applying magnetic field. Therefore, since pulse waveform distortion of a flux quantum signal propagating through the control line for applying magnetic field can be reduced, the above arrangement is also advantageous for maintaining high speed, which is a second object of the present invention to be described below.

For maintaining high speed, which is the second object of the present invention, splitters for producing two flux quanta from one flux quantum are cascaded to generate flux quantum signals corresponding to the number of SQUIDs. The splitters are connected through a Josephson transmission line for maintaining a pulse characteristic, and each branch route is provided with an equal number of splitters and an equal number of Josephson transmission line stages. Thus, on any branch route to be taken by a flux quantum signal, a substantial distance of propagation thereof is identical, i.e., a flux quantum signal reaches each SQUID at the same time. Further, in the present invention, a Josephson transmission line is also disposed on the outlet side of a control line for applying magnetic field of each SQUID, and the Josephson transmission line is terminated with termination grounding through a resistor. The Josephson transmission line disposed on the outlet side of the control line for applying magnetic field of each SQUID prevents signal reflection and waveform distortion of a flux quantum signal propagating through the control line for applying magnetic field. The Josephson transmission line disposed on the outlet side thereof is particularly effective in operation at a high frequency exceeding 10 GHz.

In a situation where it is necessary to treat a low-frequency signal, i.e., a flux quantum signal having a longer time interval, an SFQ/dc converter circuit is disposed at an input part of a superconductor signal amplifier to provide a pseudo-level signal corresponding to a pulse signal in the present invention.

For enhancement in responsivity, which is a third object of the present invention, a magnetic shielding film is eliminated from most of the array region of series-connected SQUIDs in a superconductor signal amplifier. In a modified arrangement, a magnetic shielding film part at a position corresponding to each of the series-connected SQUIDs is isolated from the other magnetic shielding film parts because of the reason mentioned below:

In general, since a magnetic shielding film is also used as a circuit ground, there occurs a capacitance between a SQUID and the magnetic shielding film. As an output voltage is increased, this capacitance provides a larger adverse effect on the response characteristic of an amplified signal to an input signal. A SQUID bias current, which is also used as a current source for an output signal, is small (0.1 to 0.2 mA), and therefore a capacitive charging time is prolonged.

The present invention will now be described in detail by way of example with reference to the accompanying drawings.

Embodiment I

Referring to FIG. 1, there is shown a schematic diagram of embodiment I according to the present invention. In FIG. 1, reference numeral 1 indicates a single flux quantum (SFQ) circuit, and a flux quantum signal output therefrom is amplified by a superconductor signal amplifier of the present invention. A flux quantum signal output from the SFQ circuit 1 is introduced to a splitter 2 (SP) of a first stage through a Josephson transmission line. At the splitter 2, the flux quantum signal is split into two signals, and each of the two signals is fed to a splitter 5,6 of a second stage through a Josephson transmission line (JTL) 3,4. In the following explanation and FIG. 1, some reference numerals and descriptions thereof are omitted intentionally for the sake of simplicity. At the splitter 5 of a second stage, the flux quantum signal is further split into two signals, and each of the two signals is fed to a splitter 8 of a third stage through a Josephson transmission line 7. Further, the flux quantum signal is fed to a splitter 10 of a fourth stage through a Josephson transmission line 9. In embodiment I, at the splitter 10 of the fourth stage, the flux quantum signal is split into two signals, and each of the two signals is finally applied to a control line for applying magnetic field 22,23 of a SQUID 20,21 through a Josephson transmission line 11,12. The same arrangement is made for the other splitters and Josephson transmission lines associated therewith. Hence, in embodiment I, there are provided four stages of splitters, and sixteen SQUIDs are connected in series as shown in FIG. 1.

The control line for applying magnetic field 22,23 is connected to a Josephson transmission line 13,14 and grounded through a terminal resistor 15,16. Reference numeral 17 indicates a power source which supplies a bias current to each SQUID. A series circuit including the series-connected SQUIDs and the power source 17 is grounded at both ends thereof.

Figure 2:
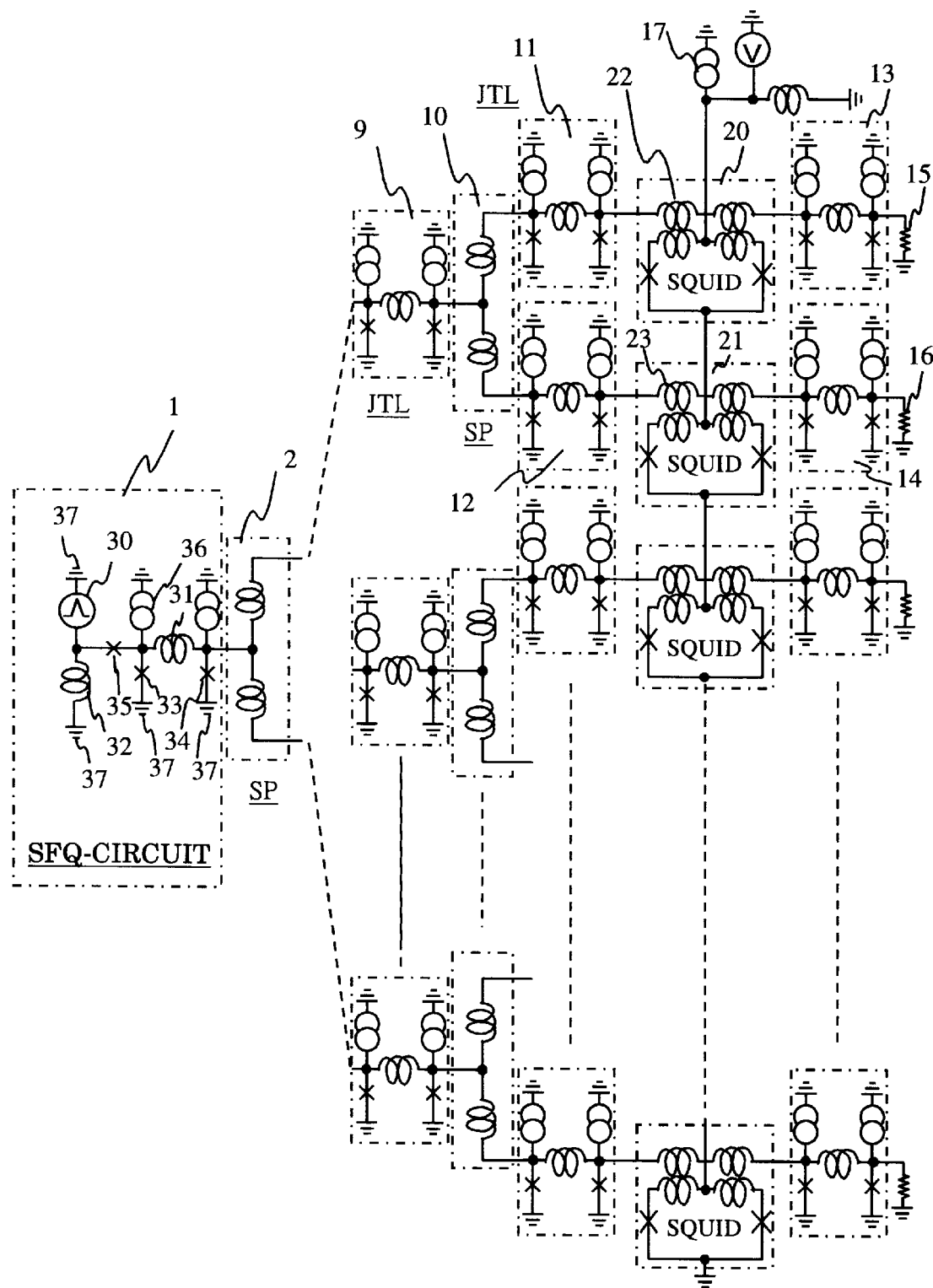
FIG. 2 is a diagram showing an equivalent circuit of the first preferred embodiment presented in FIG. 1.

Referring to FIG. 2, there is shown an equivalent circuit of embodiment I. In FIG. 2, the uppermost and lowermost parts are shown entirely while the other parts therebetween are omitted partially, and like members are accorded the same reference numerals as those indicated in FIG. 1. In the equivalent circuit shown in FIG. 2, a circuit which generates a flux quantum using an alternating current source 30 is used as an example of the single flux quantum circuit 1. In the single flux quantum circuit 1, a superconductive closed loop formed of an inductor 31 and Josephson junctions 33 and 34 is supplied with an alternating current from the alternating current source 30 via a Josephson junction 35. One end of an input line of the alternating current source 30 is connected to ground 37 via an inductor 32, and the other end thereof is also connected to ground 37. When an alternating current is fed to the superconductive closed loop, a single flux quantum is produced thereon. Reference numeral 36 indicates a bias source, which has one end thereof connected to the Josephson junctions 33 and 34 and the other end thereof connected to ground 37 for applying a proper current to the Josephson junctions 33 and 34. The other end of each of the Josephson junctions 33 and 34 is connected to ground 37. In FIG. 2, the same circuit symbols are used to represent the same circuit elements in the equivalent circuit of the superconductor signal amplifier of the present invention, but some reference numerals are omitted intentionally for the sake of simplicity. As a Josephson junction, either a type of Josephson junction in which resistors are parallel-connected with a tunnel junction or a type of Josephson junction which does not have a hysteresis in the current-voltage characteristic may be used. In embodiment I, the latter type of Josephson junction is used.

Figure 3:
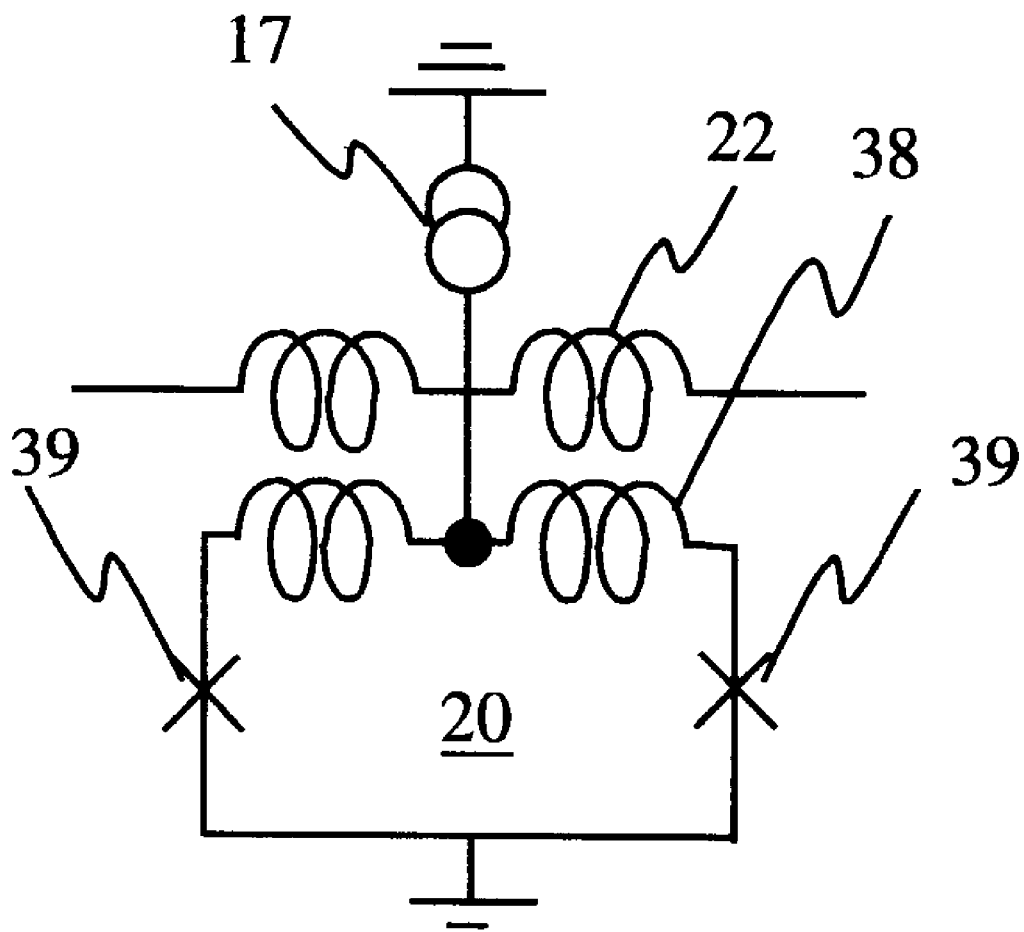
FIG. 3 is a detail diagram of an equivalent circuit of a SQUID at the uppermost position in the first preferred embodiment.

Referring to FIG. 3, there is shown a detail diagram of an equivalent circuit of the SQUID 20 disposed at the uppermost position in embodiment I. An input inductor 38 magnetically coupled with the control line for applying magnetic field 22 and two Josephson junctions 39 are so arranged as to form a superconductive closed loop (SQUID loop inductor).

Figure 4:
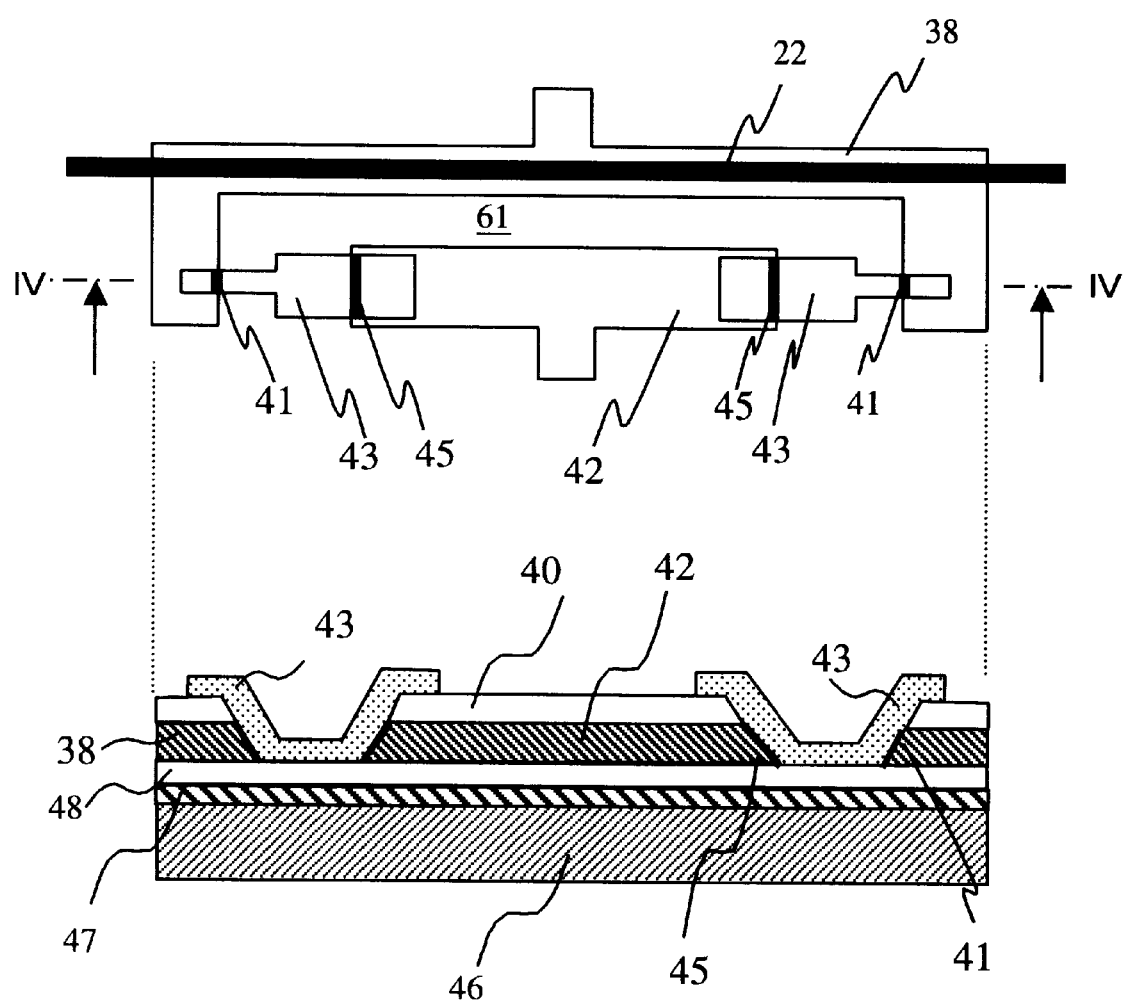
FIG. 4 shows a layout of a SQUID 20 corresponding to FIG. 3 and a cross-sectional structure view taken along line IV—IV in the direction of the arrow.

The superconductor signal amplifier and the single flux quantum circuit are fabricated using an oxide superconductive thin film. FIG. 4 shows a layout of the SQUID 20 presented in FIG. 3 and a cross-sectional structure view taken along line IV—IV in the direction of the arrow. With particular reference to FIG. 4, the following describes the structure of the SQUID 20. On an La—Sr—Al—Ti oxide single crystal substrate 46, a Y—Ba—Cu oxide superconductive thin film is formed as a magnetic shielding film 47. Through an La—Sr—Al—Ti oxide or Sr—Ti oxide interlayer insulating film 48, a Y—Ba—Cu oxide superconductive thin film is formed, which is arranged as a lower superconductive electrode to provide an inductor 42, an input inductor 38, a Josephson junction 41, and a coupling part 45. On the Y—Ba—Cu oxide superconductive thin film, a Ce oxide thin film is formed as an interlayer insulating film 40 for upper and lower superconductive electrodes. A slope (edge) surface layer of the lower superconductive electrode is irradiated with an ion beam to provide an amorphous property and then heated to provide an insulating property, which is used as a barrier layer for the Josephson junction. Further, a Y—Ba—Cu oxide superconductive thin film is formed for use as the control line for applying magnetic field 22 and inductor 43. The Josephson junction 41 is formed at a coupling part between an end of the input inductor 38 and the inductor 43. The coupling part 45 between the inductor 42 and the inductor 43 formed in the upper superconductive electrode is arranged to have a width sufficient with respect to the width of the Josephson junction 41, thereby realizing a superconductive contact.

The input inductor 38, the Josephson junction 41, the inductor 42 formed in the lower superconductive electrode, and the inductor 43 formed in the upper superconductive electrode are arranged to provide a superconductive closed loop. The critical current value of each Josephson junction 41 is 0.1 mA to 0.2 mA, and the inductance of the superconductive closed loop is 10 pH to 20 pH. A mutual inductance between the control line for applying magnetic field 22 and the input inductor 38 is 5 pH to 15 pH. Each resistor element is provided by forming a gold thin film between the upper and lower superconductive electrodes.

In embodiment I, each splitter SP is formed as an inductor circuit for connection between Josephson transmission lines at respective adjacent stages. In a modified embodiment, the splitter may be formed in a structure similar to that of the Josephson transmission line. To be more specific, the splitter may be formed in such a fashion that two output lines are disposed for an input line and that a Josephson junction and a direct current bias line are provided. In this modified embodiment, the critical current value of the Josephson junction, inductance, and other factors are the same as those of the Josephson transmission line.

Figure 5:
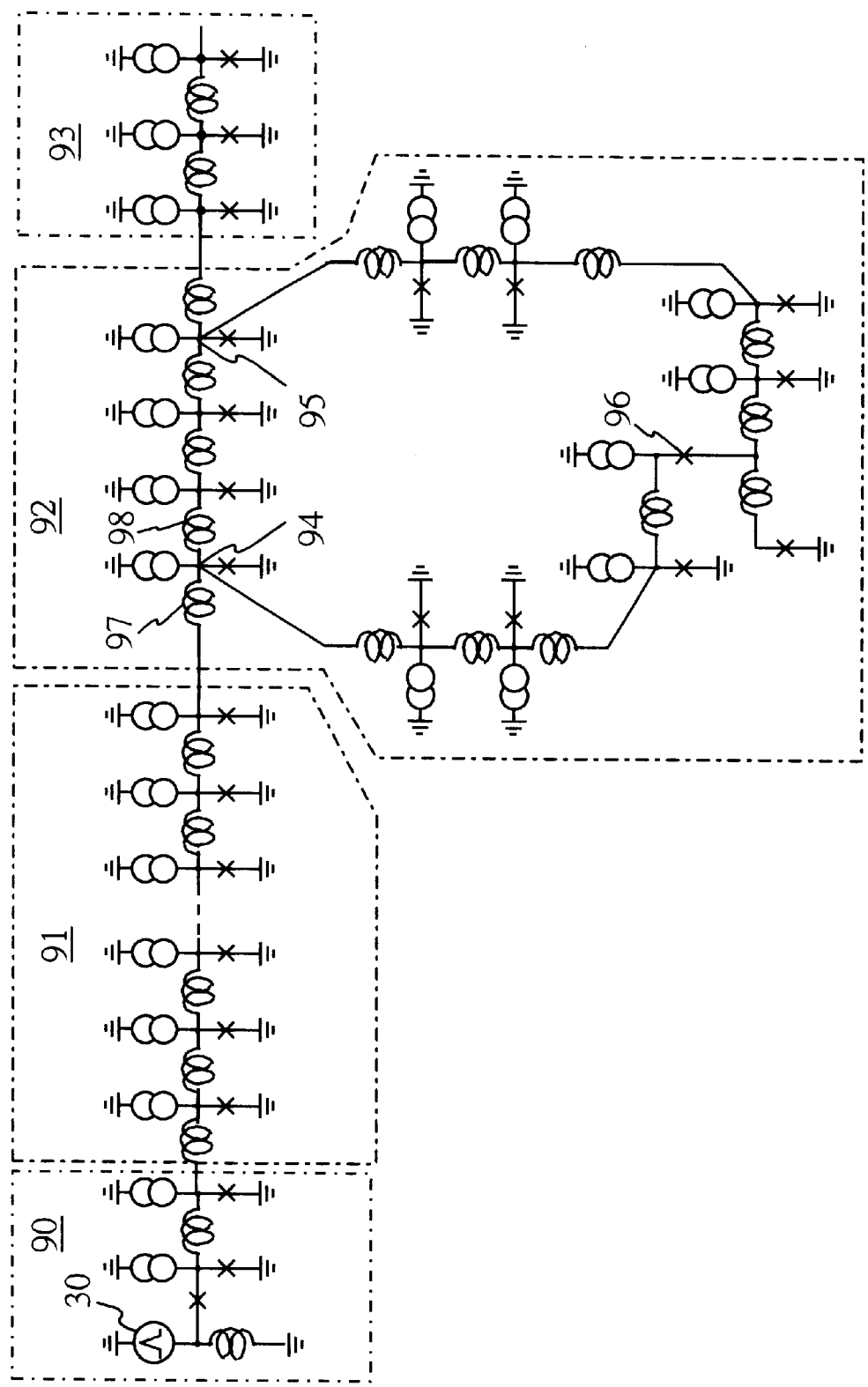
FIG. 5 is a block diagram showing a ring oscillator used for evaluating operation of a superconductor signal amplifier in the first preferred embodiment.

Referring to FIG. 5, there is shown a block diagram of a ring oscillator used for evaluating operation of the superconductor signal amplifier in embodiment I. In the single flux quantum circuit 1 shown in FIG. 2, it is practically difficult to generate an extremely-high-frequency flux quantum signal having a width of the order of picoseconds which is to be treated in the present invention. That is to say, advantageous effects of the present invention cannot be confirmed using the single flux quantum circuit 1. Therefore, in evaluation of the superconductor signal amplifier in embodiment I, the ring oscillator shown in FIG. 5 was used to generate a flux quantum signal, and an output of the flux quantum signal generated by the ring oscillator was amplified by the superconductor signal amplifier.

The ring oscillator comprises an oscillation start input part 90, an oscillation input Josephson transmission line 91, a Josephson transmission line ring 92, and an output Josephson transmission line 93. The oscillation start input part 90 has the same structure as that of the single flux quantum circuit 1 shown in FIG. 2. When a flux quantum signal generated by the oscillation start input part 90 is applied to the input Josephson transmission line 91, the flux quantum signal propagates through a plurality of stages of the input Josephson transmission line 91. The Josephson transmission line ring 92 comprises connection points 94 and 95 each functioning as a splitter, and a Josephson junction 96 functioning as a unidirectional circuit element. The flux quantum signal from the input Josephson transmission line 91 is fed to the connection point 94 of the Josephson transmission line ring 92 via an inductor 97, and at the connection point 94, the flux quantum signal is split in both directions of the Josephson transmission line ring 92 for propagation. After this splitting, only the flux quantum signal fed to an inductor 98 propagates through a plurality of stages of the Josephson transmission line ring 92 for circulation. When the flux quantum signal in circulation reaches the connection point 95, the flux quantum signal is split into two signals, one of which is delivered to the output Josephson transmission line 93 for use as a high-speed signal.

Figure 6:
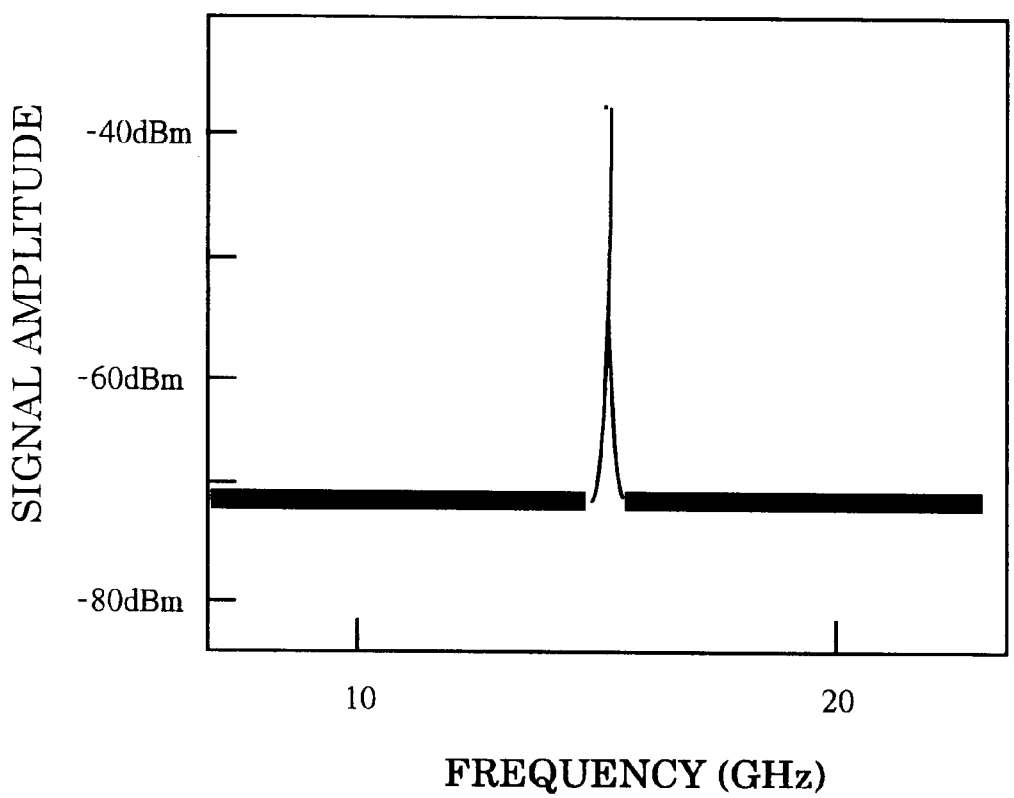
FIG. 6 is a diagram showing a result of frequency characteristic measurement, using a spectrum analyzer, of an output from the superconductor signal amplifier of the first preferred embodiment under condition that an output of the ring oscillator presented in FIG. 5 was introduced into the superconductor signal amplifier.

Referring to FIG. 6, there is shown a result of frequency characteristic measurement, using a spectrum analyzer, of an output from the superconductor signal amplifier of embodiment I under condition that an output of the ring oscillator presented in FIG. 5 was introduced into the superconductor signal amplifier. In the frequency characteristic measurement, the superconductor signal amplifier was run at an operating temperature of 30 K. An oscillation output frequency from the ring oscillator was controlled in the range of 10 GHz to 20 GHz by regulating the frequency of the alternating current source 30 or the magnitude of a bias current to the Josephson junction. In measurement of a flux quantum signal output from the ring oscillator, a peak was detected in the frequency range of 10 GHz to 20 GHz even through the superconductor signal amplifier of embodiment I. A detected frequency spectrum agreed with an oscillation frequency expected from the magnitude of a bias current to the ring oscillator. In consideration of attenuation due to wiring connection from the chip containing the superconductor signal amplifier to the spectrum analyzer, a calculated output voltage of the superconductor signal amplifier was 5 mV or more. Since a presumable peak voltage of the flux quantum signal output from the ring oscillator was as small as 0.3 mV, it was confirmed that a flux quantum signal was amplified by the superconductor signal amplifier according to the number of SQUIDs contained therein.

Figure 7:
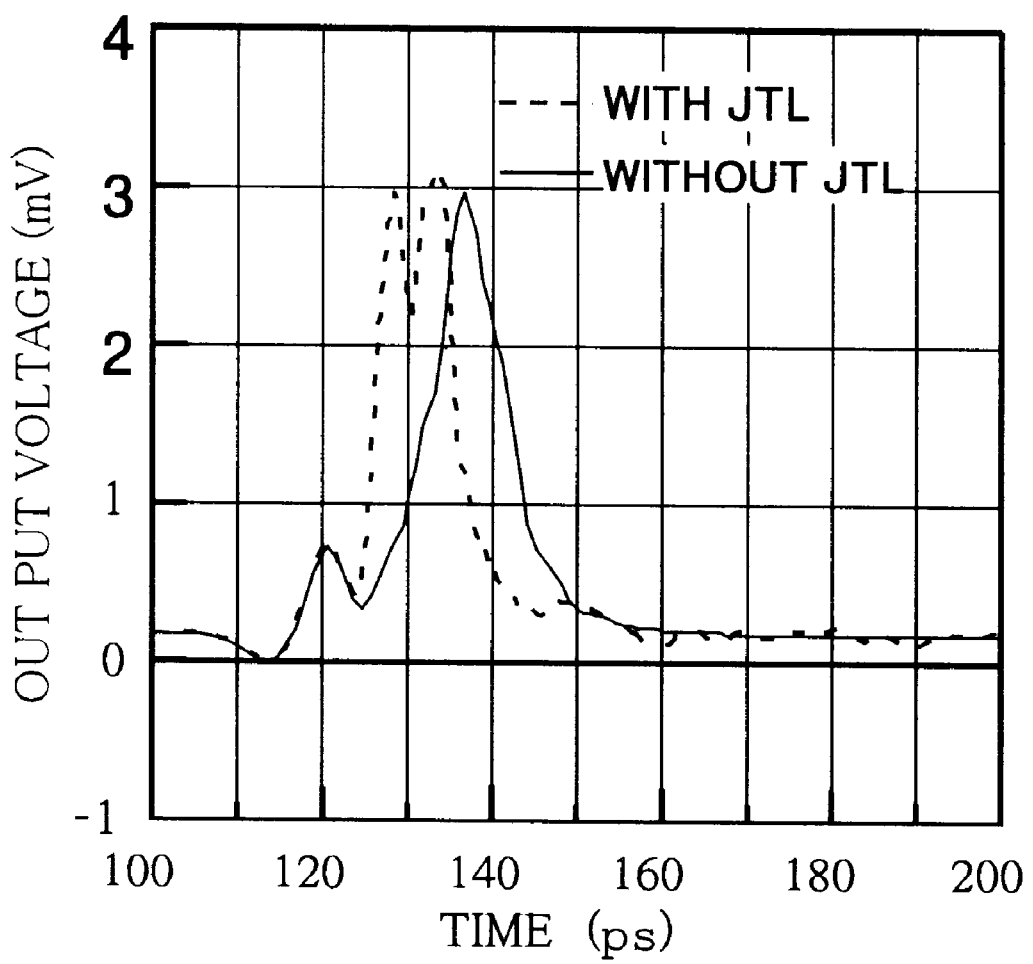
FIG. 7 is a diagram showing an output waveform comparison between a case where a Josephson transmission line is provided after a SQUID and a case where a Josephson transmission line is not provided thereafter in a simulation of an Nb superconductive circuit to be described in a second preferred embodiment.

In particular, amplification at a frequency as high as 20 GHz was attributable to the arrangement in which the Josephson transmission line was provided on the control line for applying magnetic field 22,23 after each SQUID. FIG. 7 shows an output waveform comparison between a case where the Josephson transmission line is provided after each SQUID and a case where the Josephson transmission line is not provided thereafter in a simulation of an Nb superconductive circuit to be described in embodiment II. As can be seen from FIG. 7, in a case where the Josephson transmission line is provided on the control line for applying magnetic field 22,23 after each SQUID, the waveform is ended in a period shorter by at least 5 ps. This value corresponds to 10 ps per cycle, and hence the frequency characteristic will be enhanced significantly.

Where the Josephson transmission line is disposed as in embodiment I, the output voltage of each SQUID rises steeply and then decreases once. This phenomenon is caused by a delay in stray capacity charging when the SQUID output voltage rises steeply. By way of contrast, where the Josephson transmission line is not provided after each SQUID, since the output voltage of the SQUID does not rise so rapidly due to a propagation delay as in embodiment I, stray capacity charging occurs while the SQUID output voltage rises. In the latter case, although the rise of the SQUID output voltage becomes somewhat gentler, the phenomenon that the SQUID output voltage decreases once after its rise does not take place.

Embodiment II

Figure 8:
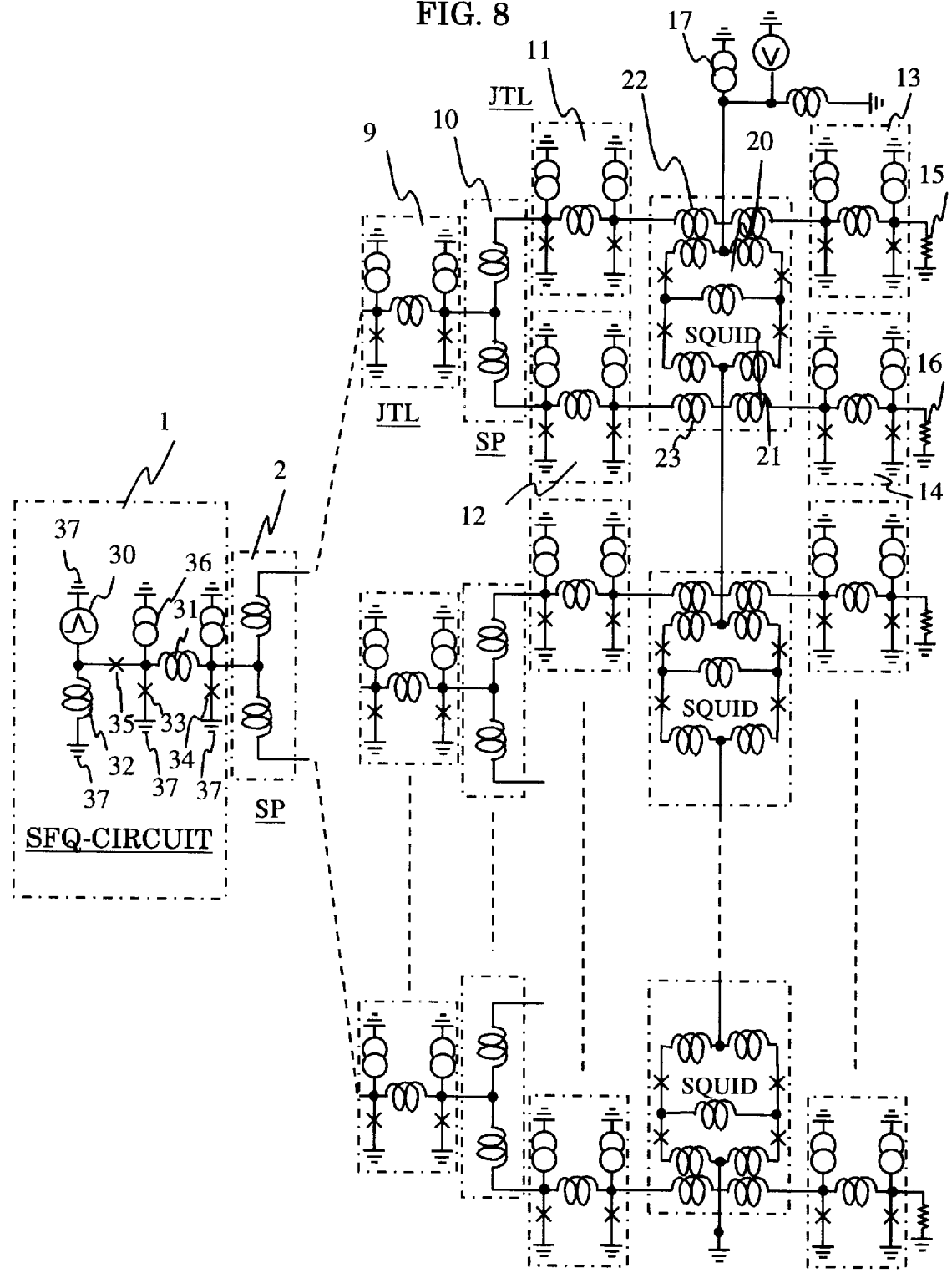
FIG. 8 is a diagram showing an equivalent circuit of the second preferred embodiment of the present invention.

Referring to FIG. 8, there is shown an equivalent circuit of embodiment II (similar to embodiment I in FIG. 2) arranged for enhancement in magnetic field detection sensitivity of each SQUID. In embodiment II, a superconductor signal amplifier is fabricated using an Nb superconductive film. In device fabrication process, on a silicon wafer substrate, an Nb film is formed to provide a superconductive electrode and a magnetic shielding film, an Si oxide thin film is formed to provide an interlayer insulating layer, and an Mo thin film is formed to provide a shunt resistor. As a Josephson junction, an Nb/AlOx/Nb tunnel junction is formed. The shunt resistor is parallel-connected with the Josephson junction. Thus, the Josephson junction does not have a hysteresis in the current-voltage characteristic. In FIG. 8, the shunt resistor is not shown for the sake of simplicity. As in embodiment I shown in FIG. 2, each splitter in embodiment II is also formed as an inductor for connection between Josephson transmission lines at respective adjacent stages.

The circuit configuration in FIG. 8 is essentially the same as that of embodiment I in FIG. 2. In embodiment II, a flux quantum signal split through a splitter 10 at the last stage is fed to two SQUIDs in a pair. A part of a superconductive closed loop inductor (SQUID loop inductor) is shared, and the shared part thereof is widened in terms of line width for decreasing an inductance in the shared part. Further, a control line for applying magnetic field is magnetically coupled with a part of the inductor which is different from the shared part.

Figure 9:
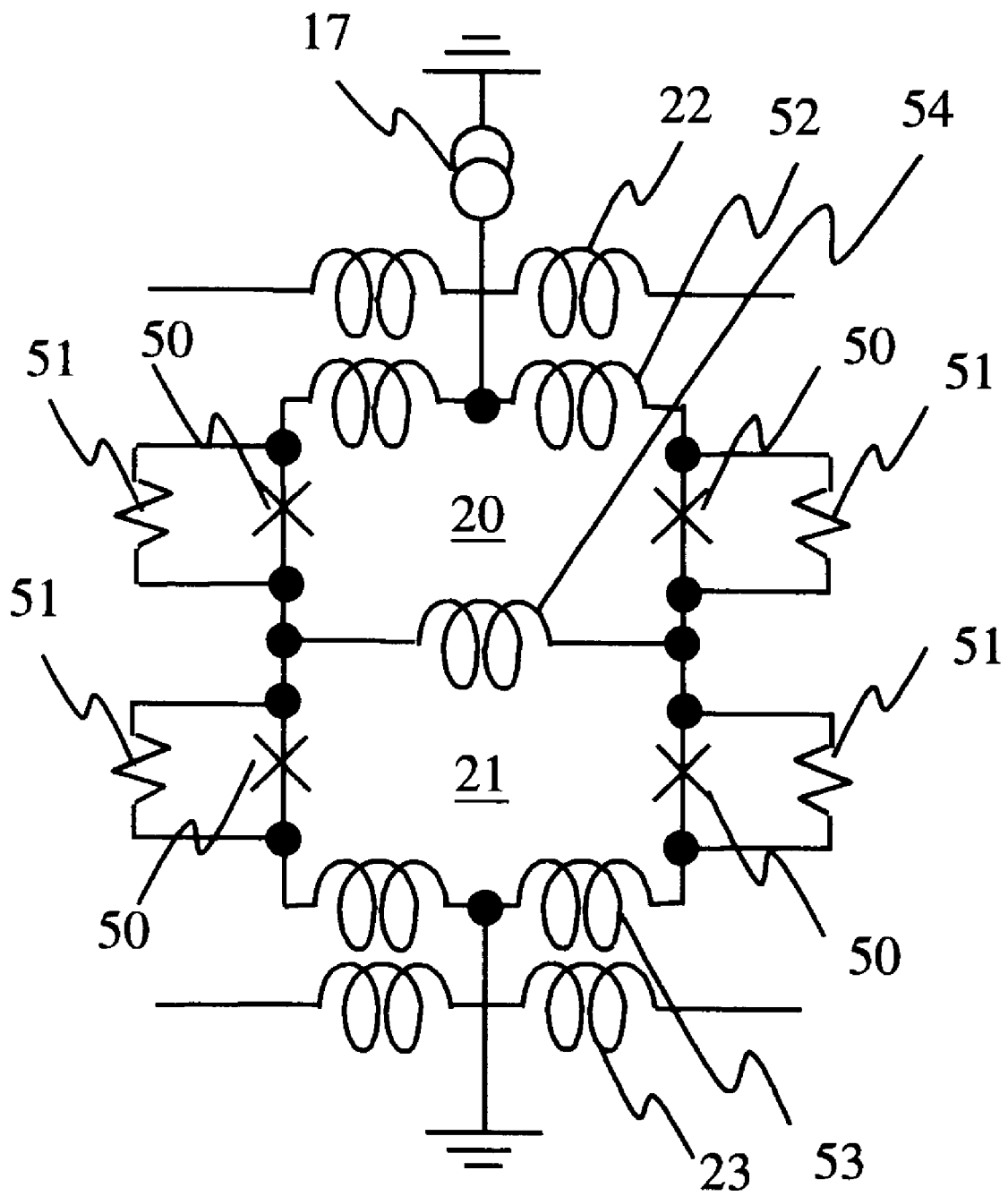
FIG. 9 is a diagram showing an example of a SQUID circuit configuration of in the second preferred embodiment concerning a superconductor signal amplifier fabricated using an Nb superconductive film and related materials.
Figure 10:
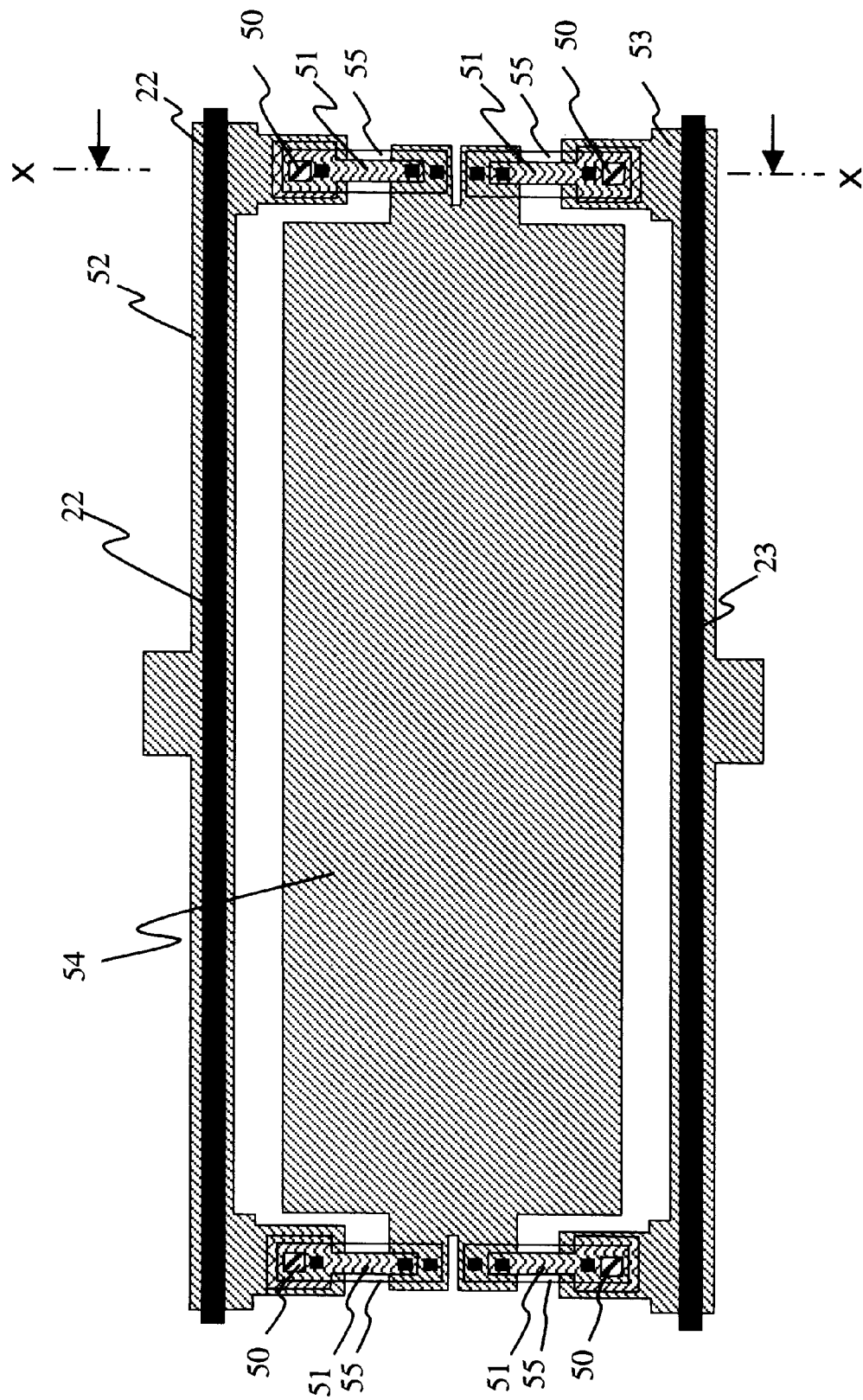
FIG. 10 is a schematic diagram showing a circuit layout corresponding to the SQUID circuit configuration presented in FIG. 9.
Figure 11:
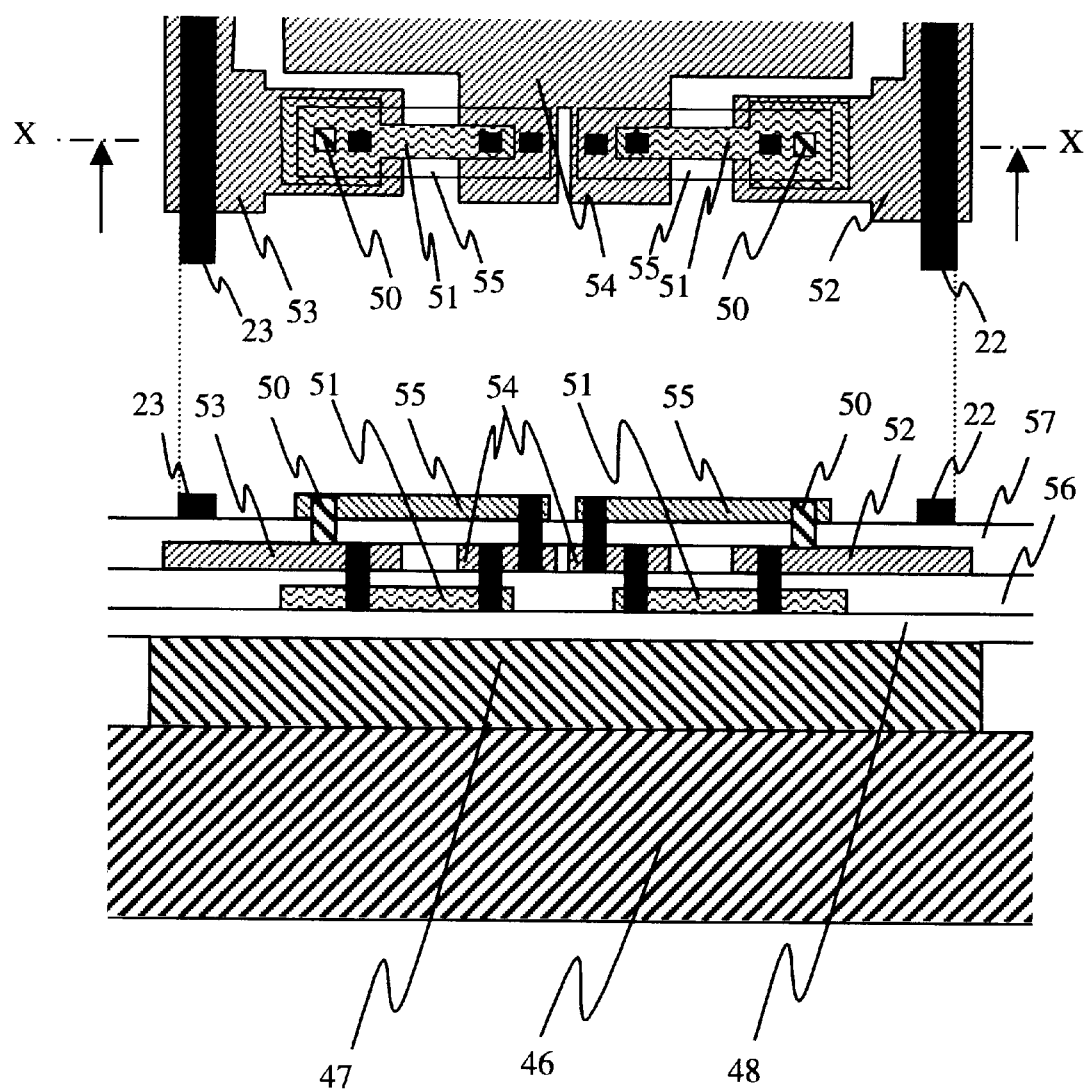
FIG. 11 shows a layout of an end part of a pair of SQUIDs 20 and 21 in the second preferred embodiment and a cross-sectional structure view taken along line X—X in the direction of the arrow.

Referring to FIG. 9, there is shown a detail diagram of an equivalent circuit of a pair of SQUIDs 20 and 21 disposed at the uppermost position in embodiment II. FIG. 10 shows a schematic layout diagram of the SQUIDs 20 and 21 indicated in FIG. 9. FIG. 11 shows a layout of an end part of the pair of SQUIDs 20 and 21 and a cross-sectional structure view taken along line X—X in the direction of the arrow. In FIG. 9, a Josephson junction 50 and a shunt resistor 51 connected in parallel therewith are indicated. As to SQUID circuit parameters, each Josephson junction 50 has a critical current value of 0.1 mA, each shunt resistor 51 parallel-connected therewith has a resistance of 4 ohms, each of inductors 52 and 53, coupled with control line for applying magnetic fields 22 and 23 respectively, has a length of 100 microns and an inductance of 7 pH, and an inductor 54 shared by the two SQUIDs 20 and 21 has an inductance of 1 pH. A power current of 0.19 mA corresponding to 95% bias is used.

The SQUIDs in a pair shown in FIGS. 9, 10 and 11 are described below. On a silicon wafer substrate 46, a magnetic shielding film 47, which also serves as ground, is formed using an Nb film. On the magnetic shielding film 47, an interlayer insulating film 48 is formed using an Si oxide thin film. On the interlayer insulating film 48, a shunt resistor 51 is formed using an Mo thin film, and then an interlayer insulating film 56 is formed. Two control lines 22 and 23 to be used in a pair for applying magnetic field are formed in an upper superconductive electrode. More specifically, before formation thereof, in a lower superconductive electrode, input inductors 52 and 53 are formed at positions corresponding thereto, and an inductor 54 shared by the two SQUIDs is formed between the input inductors 52 and 53 to provide a loop for each of the input inductors 52 and 53. The end of each of the input inductors 52 and 53 is connected to the end of the shared inductor 54 via the shunt resistor 51 formed of the Mo thin film. After the interlayer insulating film 56 is formed, an extremely thin Al oxide film is formed as a junction barrier on the lower electrode, where a Josephson junction 50 is formed. Further, an Nb thin film is formed to provide the control line for applying magnetic fields 22 and 23 and the upper superconductive electrode for the Josephson junction 50. Thus, an Nb/AlOx/Nb tunnel junction is fabricated. The shared inductor 54, which provides a loop for each of the input inductors 52 and 53, is connected to an inductor 55 formed in the upper superconductive electrode via the Josephson junction 50. Between the other end of the inductor 55 and the shared inductor 54, a superconductive contact is provided. The shunt resistor 51 is parallel-connected with the Josephson junction 50, so that the Josephson junction 50 does not have a hysteresis in the current-voltage characteristic. The fabrication of this structure will be obvious to those skilled in the art and practicable by a process well known to them.

Eight pairs of SQUIDs, i.e., sixteen SQUIDs are connected in series as shown in FIG. 8. In measurement, when a flux quantum signal was input to the control line for applying magnetic field of each SQUID simultaneously, an output voltage of 0.24 mV was attained per SQUID pair. The output voltage is 30% larger than an output voltage of 0.18 mV which is attainable in a case where individual SQUIDs are connected in series as in embodiment I and a flux quantum signal is input to the control line for applying magnetic field of each SQUID simultaneously. According to the configuration of embodiment II, it is possible to attain an amplification degree larger than that in embodiment I.

For confirming that an extremely-high-frequency flux quantum signal having a width of the order of picoseconds can be amplified as expected in embodiment II, evaluation was conducted by generating a high-speed signal using the ring oscillator in the same manner as for embodiment I. A result of frequency characteristic measurement similar to that shown in FIG. 6 was attained. However, in a situation where an output frequency of 20 GHz was generated from the ring oscillator, a signal spectrum detected after amplification was widened, signifying unsatisfactory performance for a high-speed signal. This condition was caused by the phenomenon that the pulse width of a flux quantum signal passing through the control line for applying magnetic field was widened.

Embodiment III

In embodiment II described above, a part of the superconductive closed loop inductor is shared by the two SQUIDs in a pair. Thus, while maintaining a proper level of mutual inductance with the control line for applying magnetic field, the inductance of the superconductive closed loop can be reduced to increase an output voltage. In embodiment III, a distance of magnetic coupling between the control line for applying magnetic field 22,23 and the input inductor 52,53 is decreased, i.e., the width of each SQUID is decreased to 80 $\mu$m, which is 20% shorter than 100 $\mu$m in embodiment II. This arrangement makes it possible to attain an amplification degree equivalent to that in the SQUID circuit configuration of embodiment I, while keeping the pulse width of a flux quantum signal narrower in passage through the control line for applying magnetic field.

For confirming that an extremely-high-frequency flux quantum signal can be amplified as expected in embodiment III, evaluation was conducted by generating a high-speed signal using the ring oscillator in the same manner as for embodiment II. In this evaluation, it was found that a detected frequency spectrum agreed with an oscillation frequency expected from the magnitude of a bias current to the ring oscillator similarly to the frequency characteristic shown in FIG. 6. In consideration of attenuation due to wiring connection from the chip containing the superconductor signal amplifier to the spectrum analyzer, a calculated output voltage of the superconductor signal amplifier was 1.5 mV or more. In a situation where an output frequency of 20 GHz was generated from the ring oscillator, a signal spectrum detected after amplification was narrowed. If it is allowed to decrease the degree of amplification to some extent, the area of SQUIDs occupying a substantially large space in the circuit layout can be reduced by at least 20%.

Embodiment IV

Figure 12:
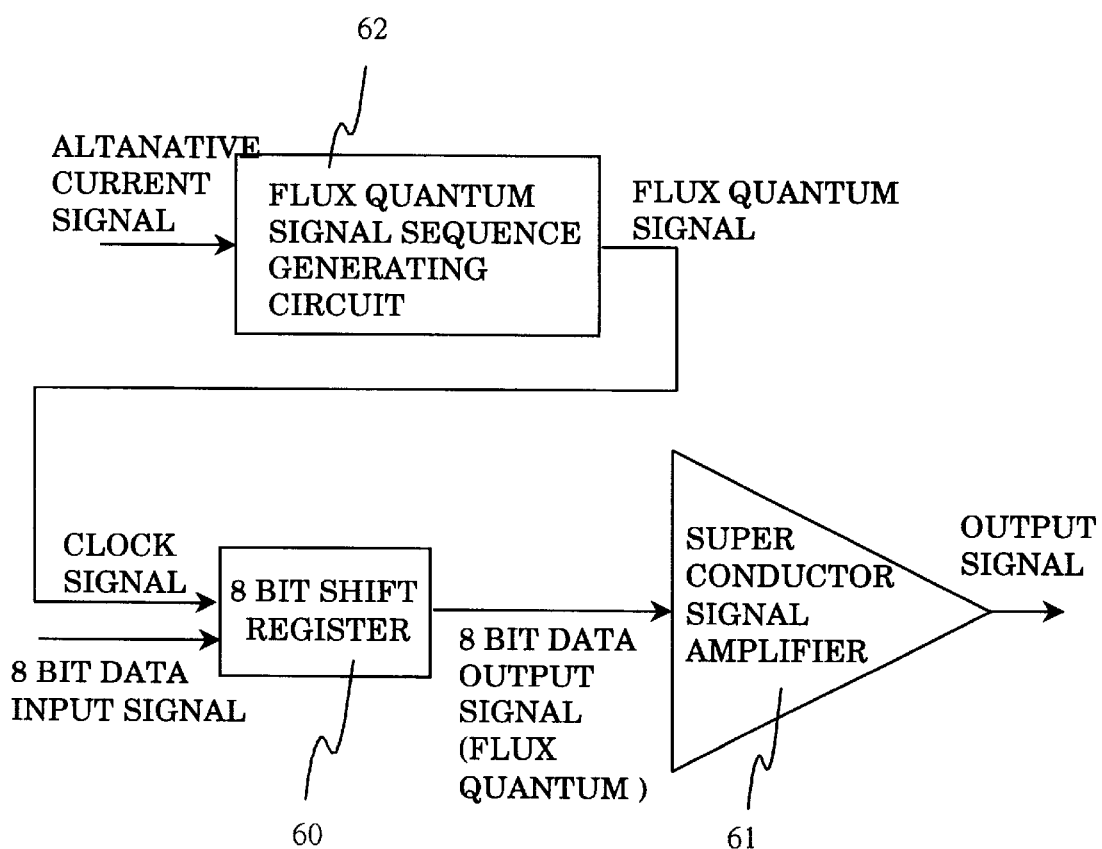
FIG. 12 is a block diagram showing a circuit configuration in which a superconductor signal amplifier is used at a shift register output stage according to a fourth preferred embodiment of the present invention.

The effectiveness of a superconductor signal amplifier having an equivalent circuit of embodiment I was examined in another application example. FIG. 12 shows a block diagram of a superconductive circuit fabricated for this purpose. In the superconductive circuit, an 8-bit shift register 60 and a superconductor signal amplifier circuit 61 were connected in series, and the shift register 60 was driven by a flux quantum signal output from a flux quantum signal sequence generating circuit 62 used as a clock generator. A data input signal was also input to the shift register 60. The superconductor signal amplifier 61 was structured similarly to embodiment I, and a flux quantum signal attained from the shift register 60 was applied to the splitter 2 shown in FIGS. 1 and 2.

Figure 13:
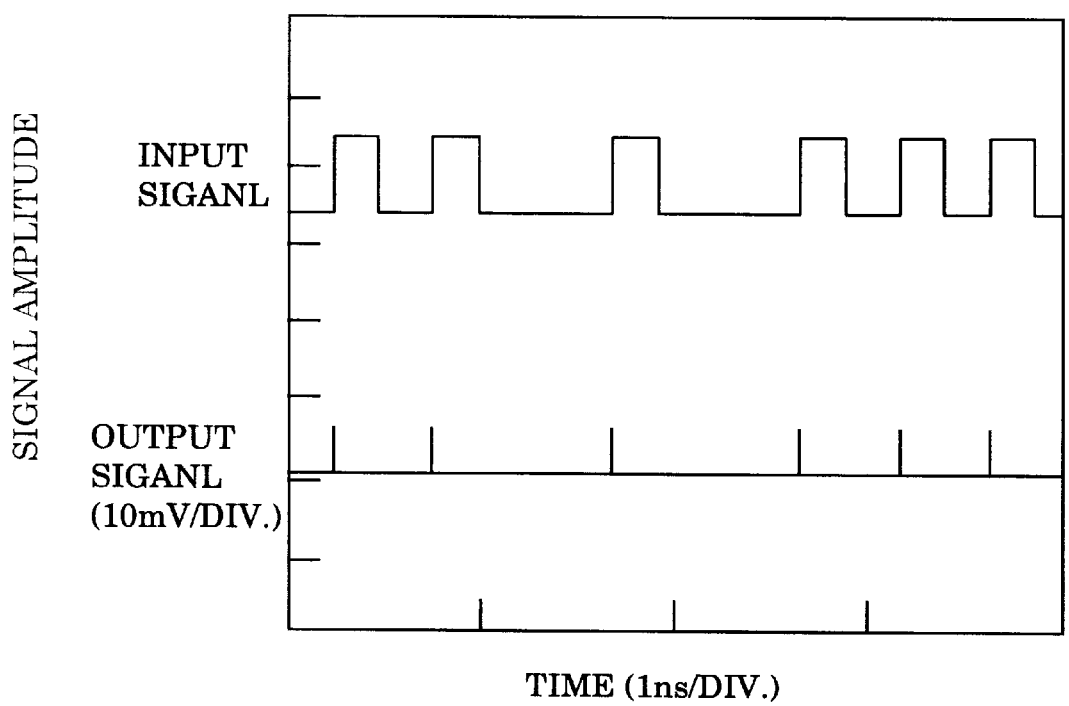
FIG. 13 is a diagram showing a result of measurement, using an oscilloscope, of an output from the superconductor signal amplifier in the fourth preferred embodiment.

As in embodiment II, the above superconductive circuit was fabricated using an Nb superconductive film. To the superconductive circuit comprising the flux quantum signal sequence generating circuit 62, shift register 60 and superconductor signal amplifier 61, a clock signal and an 8-bit data signal were input synchronously in the frequency range of 100 MHz to 10 GHz. In the flux quantum signal sequence generating circuit 62, a bias current level was set so as to provide an interval of 20 ps in ten flux quantum sequences. Using an oscilloscope, an output from the superconductor signal amplifier 61 was measured. In this measurement, an output signal sequence amplified to 5 mV or more was observed with respect to the corresponding input data signal sequence as shown in FIG. 13. The presumed peak height of a flux quantum signal is approximately 0.5 mV, and hence it is apparent that a high-frequency signal can be amplified as expected by the superconductor signal amplifier 61. Further, it was found that the use of the superconductor signal amplifier 61 enabled relatively easy attainment of an output from the shift register 60 without being buried in noise.

It is to be understood by those skilled in the art that the superconductor signal amplifier 61 can provide satisfactory performance in a form of embodiment II or III also.

Embodiment V

Figure 14:
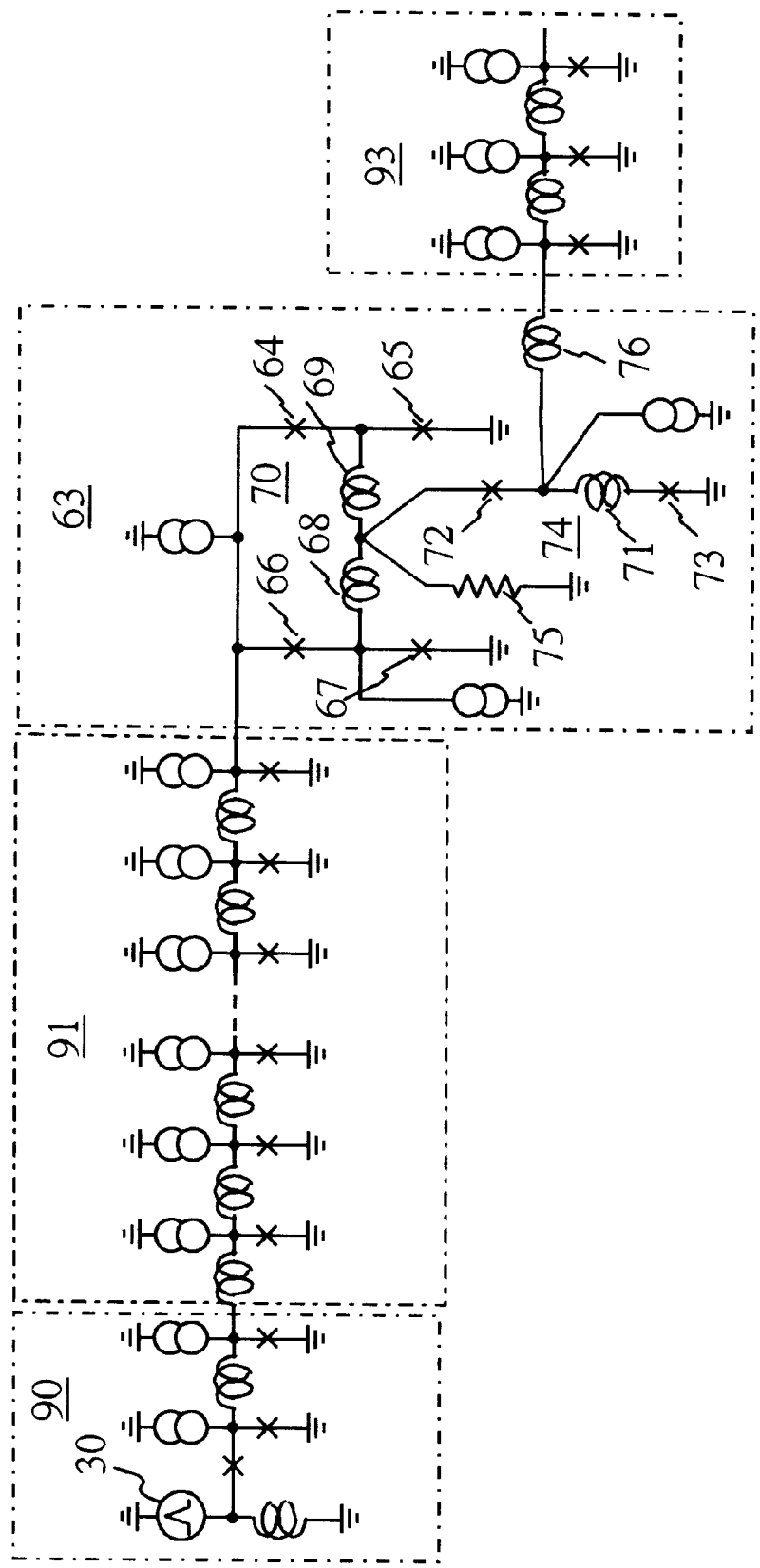
FIG. 14 is a diagram showing a configuration of a flux quantum signal sequence generating circuit employed in a fifth preferred embodiment.

In a superconductive circuit of embodiment V, the 8-bit shift register 60 and the superconductor signal amplifier 61 are connected in series in the same fashion as shown in FIG. 12. In embodiment V, a circuit shown in FIG. 14 is employed to provide a function equivalent to that of the flux quantum signal sequence generating circuit 62. This circuit has a structure similar to that of the ring oscillator shown in FIG. 5. In lieu of the Josephson transmission line ring oscillator 92 indicated in FIG. 5, there is provided a circuit 63 serving as a toggle flip-flop for alternately distributing an input signal to two output lines. In the circuit 63, a series circuit comprising Josephson junctions 64 and 65 is connected in parallel with a series circuit comprising Josephson junctions 66 and 67. One end of this circuit arrangement is used for input of a flux quantum signal, and the other end thereof is grounded. Inductors 68 and 69 are provided at connection points of the respective series Josephson junction circuits which are connected in parallel. A superconductive loop 70 is formed of the Josephson junctions 64 and 66 and the inductors 68 and 69, and this superconductive loop serves to store an input flux quantum. At a connection point between the inductors 68 and 69, there is connected a signal lead-out line 74 comprising an inductor 71 and Josephson junctions 72 and 73 for taking a flux quantum signal out of the superconductive loop 70. The connection point where the signal lead-out line 74 is connected is grounded through a resistor 75. As shown in FIG. 14, bias current sources are provided as required in the circuit 63. From a point between the two Josephson junctions 72 and 73 on the signal lead-out line 74, a flux quantum signal is delivered through an inductor 76. In the circuit 63, the direction of a current flow circulating through the superconductive loop 70 is reversed each time a flux quantum signal is output. As the direction of the circulating current flow is reversed, successive signal generation and non-generation take place. On input of a flux quantum signal, the circuit 63 delivers a flux quantum signal, and then on input of the next flux quantum signal, the circuit 63 stops delivering the flux quantum signal. That is to say, an input flux quantum signal is divided into ½ in terms of frequency. In embodiment V, the oscillation start input part 90 generates a flux quantum signal sequence using an alternating current input.

Figure 15:
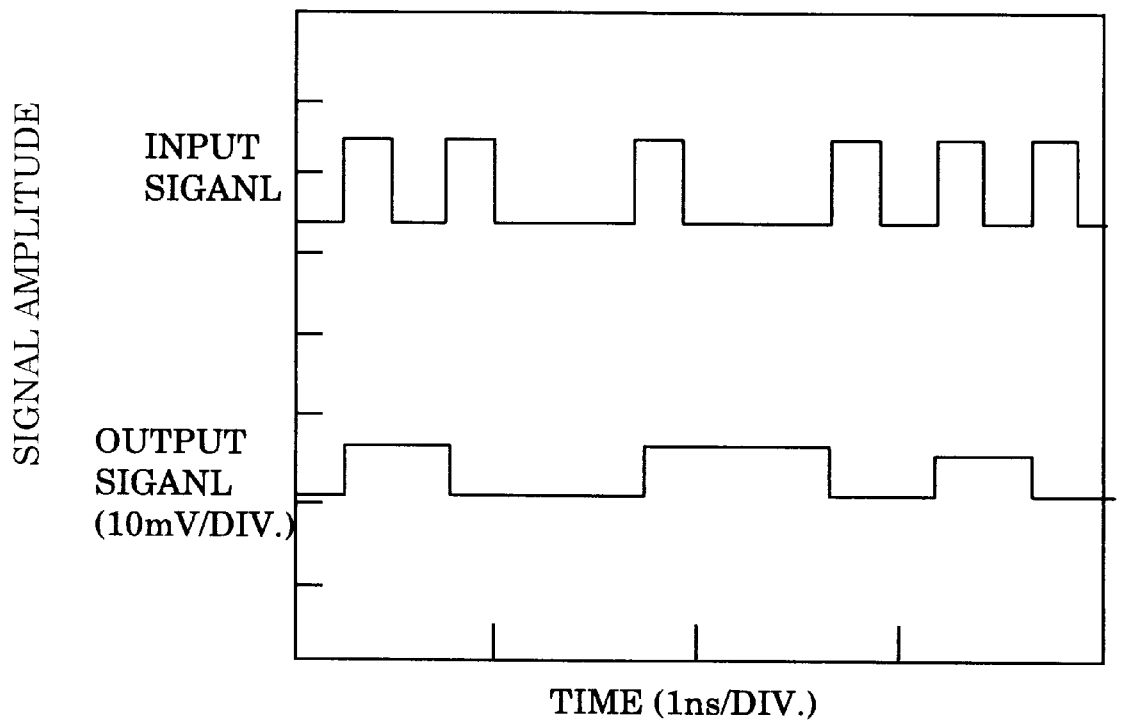
FIG. 15 is a diagram showing an exemplary result of measurement, using an oscilloscope, of an output from a superconductor signal amplifier in the fifth preferred embodiment.

The above superconductive circuit is fabricated using an Nb superconductive film. For measurement, to the superconductive circuit, a clock signal and an 8-bit data signal were input in the frequency range of 100 MHz to 10 GHz. Using an oscilloscope, an output from the superconductor signal amplifier was measured. In this measurement, it was observed that with an input flux quantum signal divided into ½ in frequency, an output signal sequence amplified to 5 mV or more was attained with respect to the corresponding input data signal sequence as shown in FIG. 15.

The presumed peak height of a flux quantum signal is 0.5 mV or less, and hence it is apparent that a high-frequency flux quantum signal can be amplified as expected by the superconductor signal amplifier. Further, it was found that the use of the superconductor signal amplifier enabled relatively easy attainment of an output from the shift register without being buried in noise.

Embodiment VI

Figure 16:
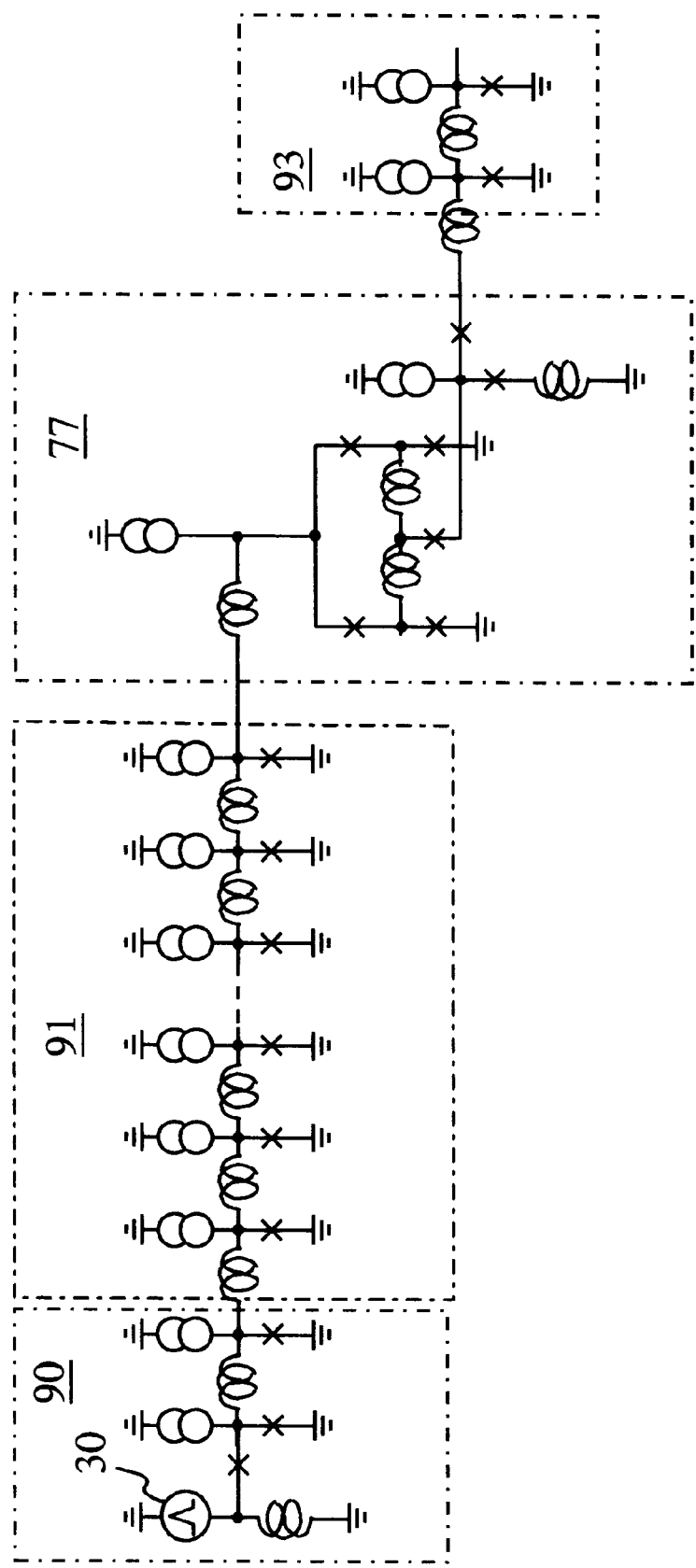
FIG. 16 is a diagram showing a configuration of a flux quantum signal generator circuit employed in a sixth preferred embodiment.

In embodiment VI, the flux quantum signal sequence generator circuit of embodiment V is simplified as shown in FIG. 16, i.e., an SFQ/dc converter circuit 77 is used instead thereof. The other parts of embodiment VI are the same as those of embodiment V. In the same manner as in embodiment I, examination was carried out in the frequency range of 10 GHz to 20 GHz. Even through the superconductor signal amplifier of embodiment VI, a peak was detected in the frequency range of 5 GHz to 10 GHz. The frequency range was reduced to ½ because of the use of the SFQ/dc converter circuit. A value double a detected frequency agreed with an oscillation frequency expected from the magnitude of a bias current to the ring oscillator. In consideration of attenuation due to wiring connection from the chip containing the superconductor signal amplifier to the spectrum analyzer, a calculated output voltage of the superconductor signal amplifier was 1.5 mV or more. Since a presumable peak voltage of the flux quantum signal output from the ring oscillator is as small as 0.2 mV, it is obvious that a flux quantum signal can be amplified by the superconductor signal amplifier according to the number of series-connected SQUIDs contained therein, i.e., 16 SQUIDs.

In a case where the SFQ circuit provides a low-speed pulse signal having a steep waveform, the embodiments V and VI are useful for treating a pulse interval of the signal from the SFQ circuit as an apparently continuous high-speed steep-pulse signal.

Embodiment VII

Figure 17:
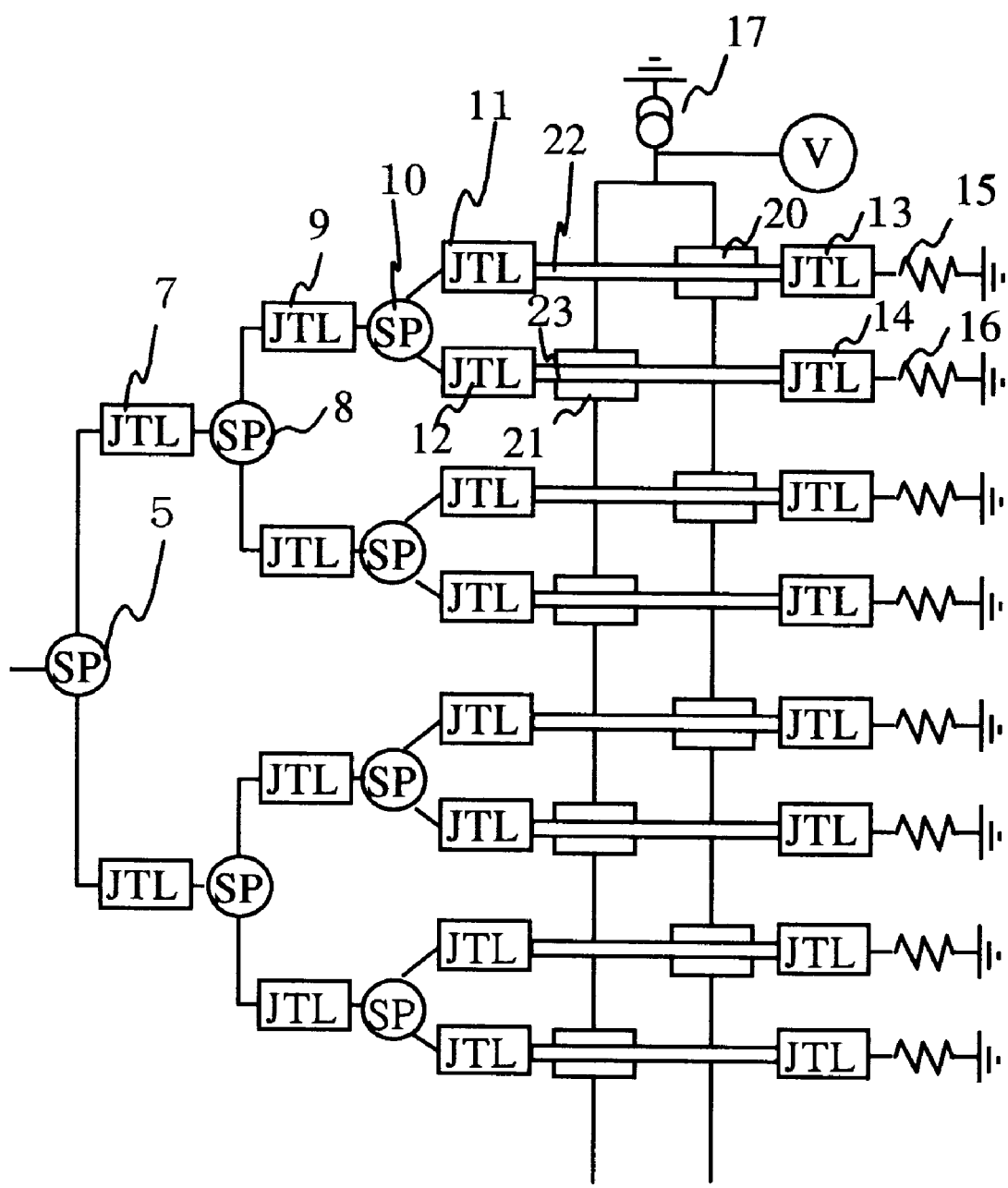
FIG. 17 is a block diagram showing an output stage configuration of a superconductor signal amplifier in a seventh preferred embodiment.

In embodiment VII, the SQUIDs are connected in series and also in parallel. FIG. 17 shows only the stages subsequent to the splitter 5 indicated in FIG. 1. Two flux quantum signals fed from the splitter of the last stage are input to two SQUIDs arranged in parallel on the upper and lower sides respectively. As a matter of course, the parallel-arranged SQUIDs are all connected in series per array. In contrast with FIG. 1, a total of 16 SQUIDs in embodiment VII are arranged in a form of eight series-connected SQUIDs by two parallel-connected arrays. In this structure, the control line for applying magnetic field for each SQUID is two times longer than that in FIG. 1.

The above arrangement is therefore disadvantageous even where a Josephson transmission line is disposed at the outlet of each SQUID to prevent the degree of steepness of a flux quantum signal waveform from being degraded. More specifically, the parallel-arranged SQUIDs provide different output timings, and also before a flux quantum signal fed to the control line for applying magnetic field goes out, the next flux quantum signal may be fed to the control line for applying magnetic field. Consequently, amplification cannot be performed while maintaining such an extremely-high-speed characteristic as that described in connection with FIG. 6. This embodiment VII is therefore effective for use with an input having a frequency lower than that in the foregoing embodiments. In implementation of embodiment VII, it is necessary to provide an SFQ/dc converter circuit on the input side of the superconductor signal amplifier.

Figure 18:
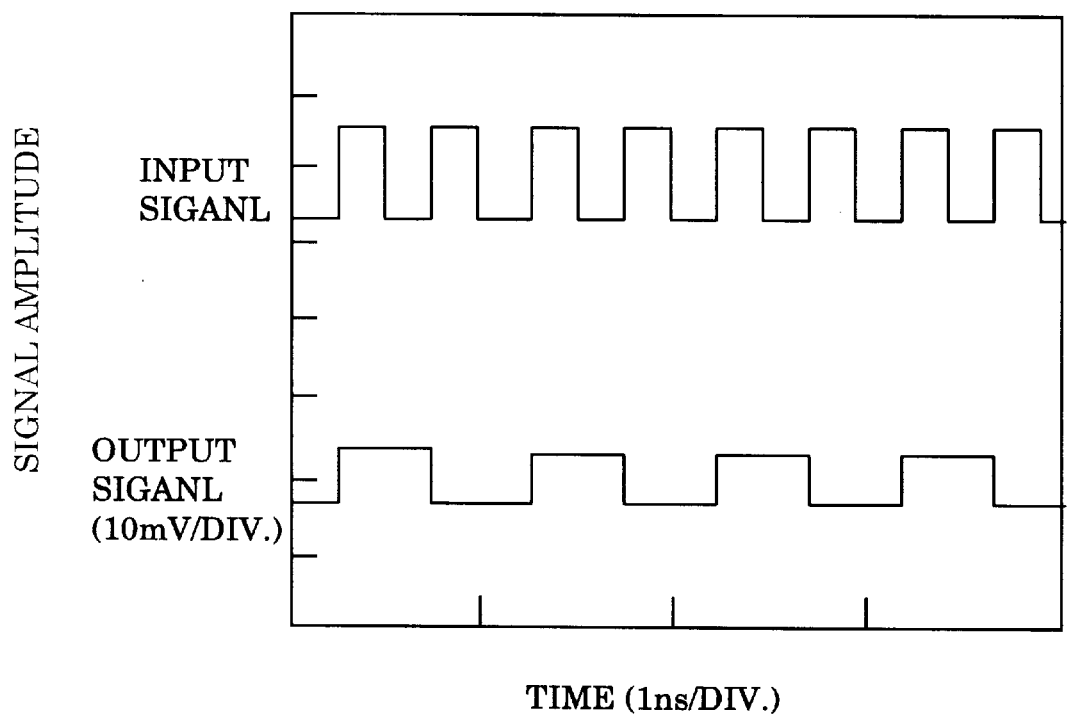
FIG. 18 is a diagram showing an exemplary result of measurement, using an oscilloscope, of an output from the superconductor signal amplifier in the seventh preferred embodiment.

In embodiment VII, the superconductive circuit is fabricated using an Nb superconductive thin film. The critical current value of the Josephson junction used in each SQUID is 0.2 mA. For measurement, to the superconductor signal amplifier of embodiment VII, an alternating current signal was input from the superconductive circuit of embodiment V in the frequency range of up to 5 GHz. Using an oscilloscope, an output from the superconductor signal amplifier was measured. In this measurement, an output waveform amplified to 2 mV or more, with a frequency thereof being ½ of the input alternating current signal, was observed as shown in FIG. 18. A bias current to each SQUID was 0.7 mA. Since a current to be taken out increases in proportion to the bias current, an output current becomes two times larger than that in a case where the SQUIDs are not connected in parallel.

It was found that embodiment VII was capable of delivering an amplified output current where an output signal frequency from the superconductive circuit was rather low. The number of parallel-arranged SQUID arrays may be increased within the range that a superconductive inductor line extended from the splitter of the last stage is operable while maintaining an operating frequency characteristic thereof.

Embodiment VIII

Figure 19:
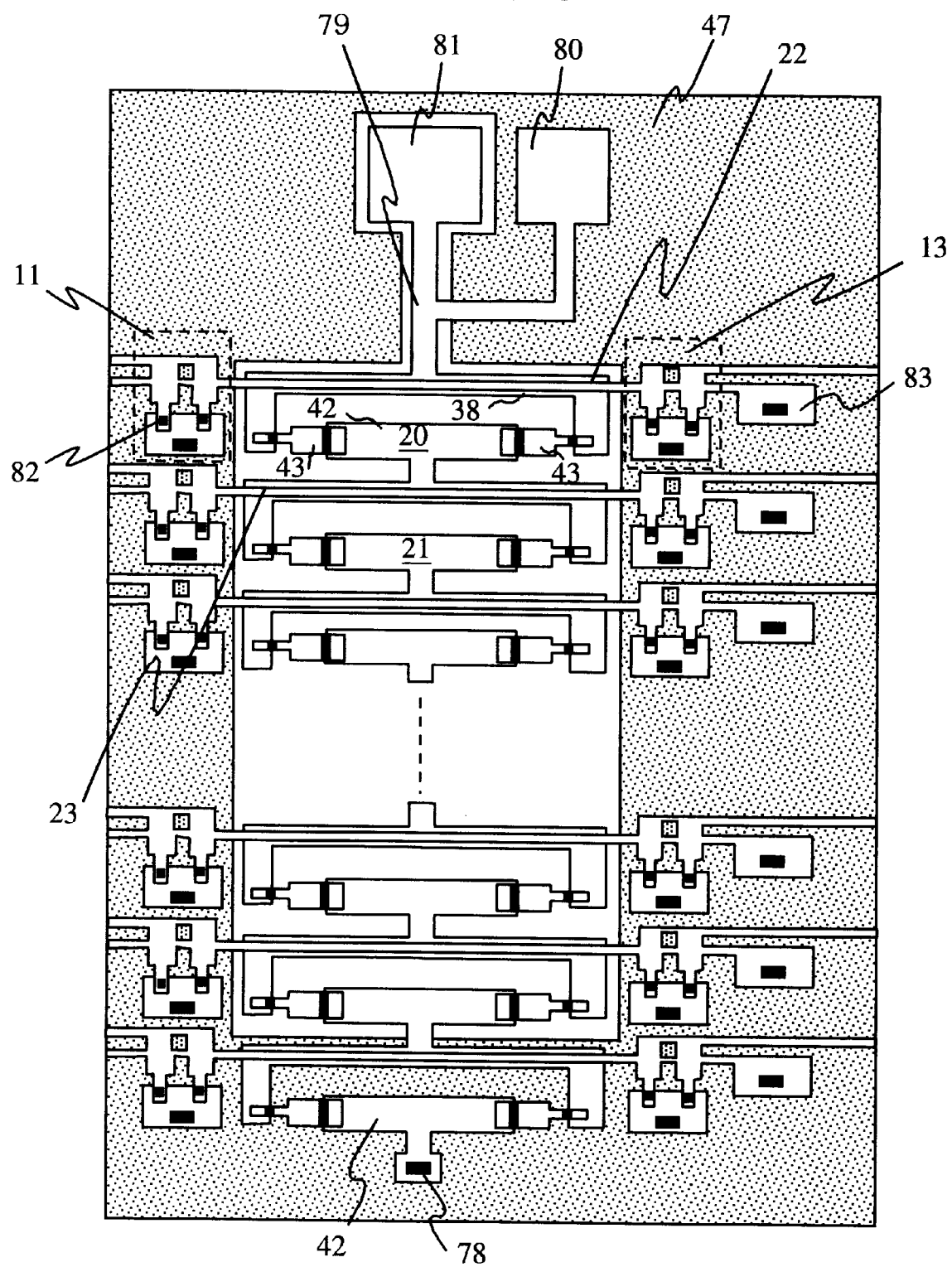
FIG. 19 is a schematic diagram showing a SQUID array circuit layout of a superconductor signal amplifier in an eighth preferred embodiment.

Referring to FIG. 19, there is shown a schematic diagram of a SQUID array circuit layout of a superconductor signal amplifier in embodiment VIII. In FIG. 19, the upper three parts and lower three parts of the superconductor signal amplifier (corresponding to those shown in FIGS. 1 and 2) are shown while the intermediate parts are omitted. The members identical to those in FIGS. 1 and 2 are accorded the same reference numerals in FIG. 19. Further, for the sake of simplicity, the insulating layers are not shown so that the essential conductive layers and connection relationships thereof can be identified with ease.

In the same fashion as described in connection with FIG. 4, in each of SQUIDs 20 and 21, a superconductive closed loop (SQUID loop inductor) comprises an input inductor 38 and an inductor 42 formed in the lower superconductive electrode and an inductor 43 formed in the upper superconductive electrode. The input inductor 38 and the inductor 43 are arranged to provide a Josephson junction, and the inductor 42 and the inductor 43 are arranged to provide a superconductive contact. The input inductor 38 is magnetically coupled with a control line for applying magnetic field 22 of the SQUID 20. The lower superconductive electrode used for forming the inductor 42 is also employed as a bias line for the SQUID 21. For the other SQUIDs, the same layout is repeated. An inductor 42 formed in the lower superconductive electrode of the SQUID at the lowermost position is connected to a magnetic shielding film 47 via a connection point 78 for ground contact. The input inductor 38 of the uppermost SQUID 20 is directly connected to a bias current source line 79, which is directly connected to an output terminal 80 and a power connection terminal 81.

On the input inductor 38 of the SQUID 20, the control line for applying magnetic field 22 is provided through an insulating film. In the same fashion as shown in FIGS. 1 and 2, the control line for applying magnetic field 22 has Josephson transmission lines 11 and 13 at input and output ends thereof. These Josephson transmission lines 11 and 13 are formed in the upper superconductive electrode used for forming the control line for applying magnetic field 22 and in the lower superconductive electrode. Between the lower and upper superconductive electrodes, there is formed a Josephson junction 82. Between the lower superconductive electrode part of the Josephson transmission line and the magnetic shielding film 47, there is provided a superconductive contact for grounding. Further, through a gold resistor layer and a lower superconductive electrode part 83, the control line for applying magnetic field 22 is connected to the magnetic shielding film for grounding.

Note that in embodiment VIII, the SQUIDs other than the lowermost SQUID are formed in a cutout area of the magnetic shielding film 47 and the inductor 42 serving as a superconductive closed loop in the lowermost SQUID is superconductively connected to the patterned region of the magnetic shielding film 42.

A parasitic capacitance is the largest factor that will decrease the operating frequency of an SFQ circuit. As the operating frequency is made higher, an adverse effect due to a parasitic capacitance increases. Where a magnetic shielding film having ground potential is provided in a SQUID, a parasitic capacitance is produced between the magnetic shielding film and an inductor of the SQUID through an interlayer insulating film. In an element having a size of tens of microns, there occurs a parasitic capacitance of 0.1 pF to 1 pF.

In an instance where a single SQUID is used, an electric charge to be stored as a parasitic capacitance is small not to cause any particular adverse effect on operation at a speed of picoseconds. By way of contrast, in an instance where a plurality of SQUIDs are connected in series, a parasitic capacitance increases in proportion to the number of elements. Further, since a higher voltage is produced, an electric charge to be stored increases approximately proportion to the square of the number of elements. Therefore, where 16 SQUIDs are provided and a maximum voltage of 6 mV is produced, an electric charge to be stored is 5 to 50 femtocoulombs. On the other hand, a bias current remains in the range of 0.1 mA to 0.2 mA according to SQUID bias conditions. Hence, a charge storage time is 25 ps to 500 ps, and a rise time of output increases accordingly.

In the superconductor signal amplifier of embodiment VIII, since most of the SQUIDs are not formed on the magnetic shielding film, there is virtually no possible cause of a delay in rise time of output. Although a parasitic capacitance is produced between the inductor of each SQUID and the control line for applying magnetic field thereof, a charge storage time is presumably ½ or less of that indicated above since the area having intersections is relatively small and the interlayer insulating film is relatively thick. In the superconductor signal amplifier of embodiment VIII, it is therefore possible to amplify a high-frequency signal of higher than 10 GHz and output the amplified high-frequency signal.

Embodiment IX

Figure 20:
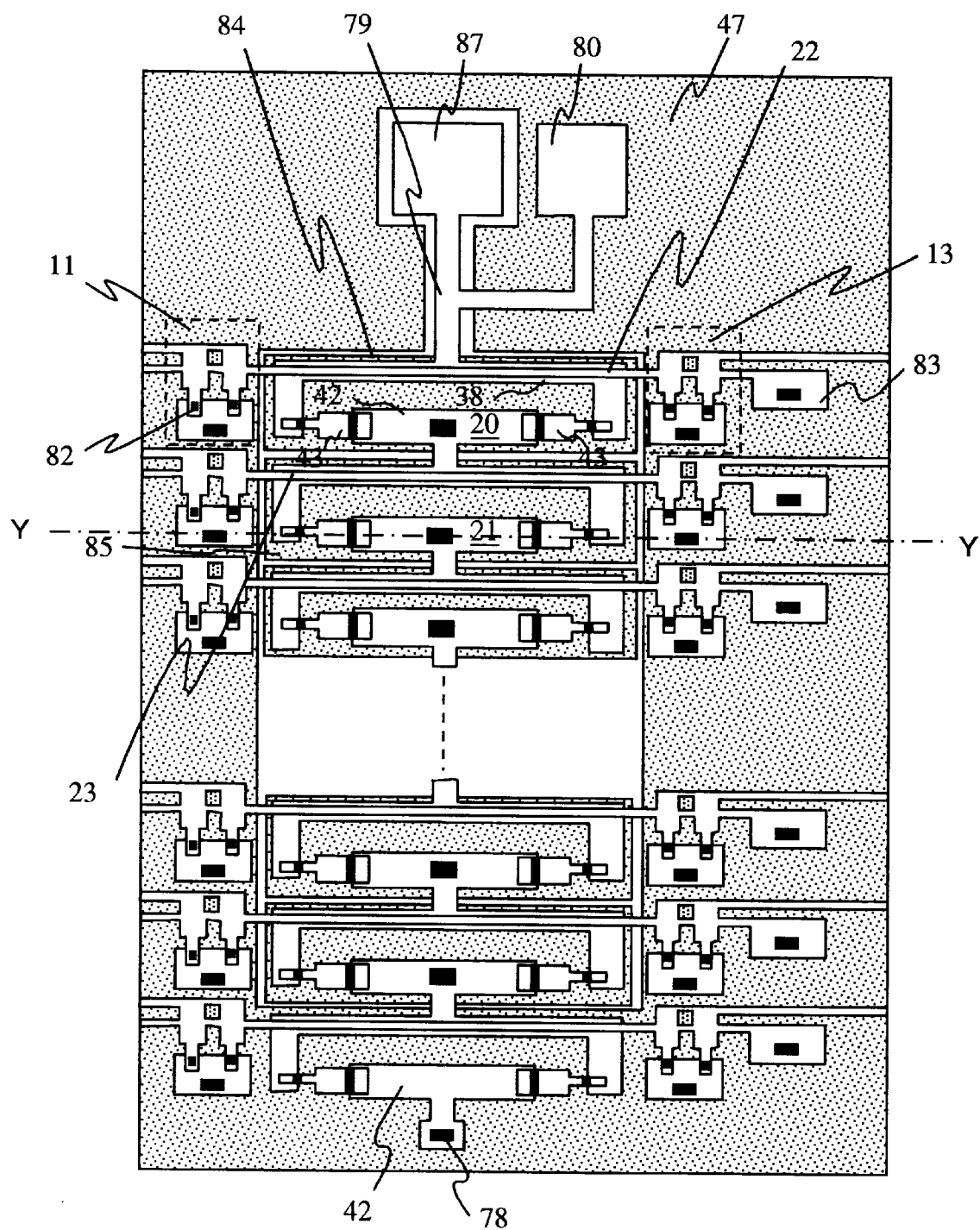
FIG. 20 is a schematic diagram showing a SQUID array circuit layout of a superconductor signal amplifier in a ninth preferred embodiment.
Figure 23:
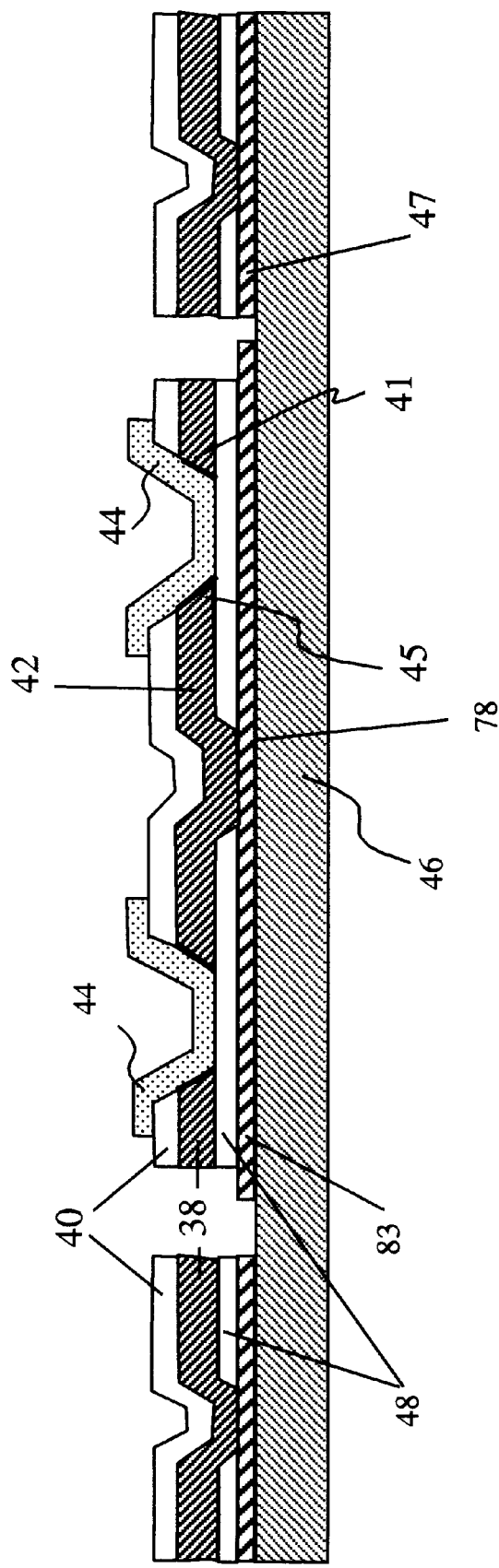
FIG. 23 is a cross-sectional structure view of a SQUID in the ninth preferred embodiment, taken along line Y—Y in FIG. 20.

Referring to FIG. 20, there is shown a schematic diagram of a SQUID array circuit layout of a superconductor signal amplifier in embodiment IX. Unlike the circuit layout shown in FIG. 19 in which the SQUIDs other than the lowermost SQUID are formed in the cutout area of the magnetic shielding film 47, embodiment IX is so arranged that each SQUID is formed on individual magnetic shielding films 84, 85, . . . , which are isolated from a surrounding magnetic shielding film 47. FIG. 23 shows a cross-sectional structure view taken along line Y—Y indicated in FIG. 20. In embodiment IX, a magnetic shielding film 47 made of Y—Ba—Cu oxide superconductive material is formed on a substrate 46 made of La—Sr—Al—Ti oxide material. Then, a magnetic shielding film 83 corresponding to each SQUID position of the SQUID array is formed for isolation from the magnetic shielding film 47. On the magnetic shielding films 47 and 83, an Sr—Ti oxide insulating film 48 is formed, and a hole is formed for electrical connection between an inductor 42 and the magnetic shielding film 83. Then, a Y—Ba—Cu oxide superconductive electrode is disposed for formation of inductors 38 and 42. Thereafter, Josephson junctions are formed as in embodiment I.

Embodiment IX is characterized in that the magnetic shielding films 84, 85, . . . formed under each SQUID (SQUID 21) are isolated from the surrounding magnetic shielding film 47 and also each of the magnetic shielding films 84, 85, . . . is electrically connected to an inductor of each SQUID via a connection point 78. In evaluation of embodiment IX, an amplified signal having a short, steep waveform almost equivalent to that of a flux quantum pulse was attained without decreasing the operating frequency of an SFQ circuit, because of the same reasons as those described in connection with embodiment VIII. To be more specific, a stray capacitance with respect to ground of each SQUID can be restricted in a part between the inductor 38 of the SQUID and the control line for applying magnetic field 22. Further, since the magnetic shielding film isolated from ground potential is provided for each SQUID, magnetic coupling between the control line for applying magnetic field 22 and the input inductor of the SQUID can be enhanced, thereby allowing the shortening of the control line for applying magnetic field 22.

Embodiment X

Figure 21:
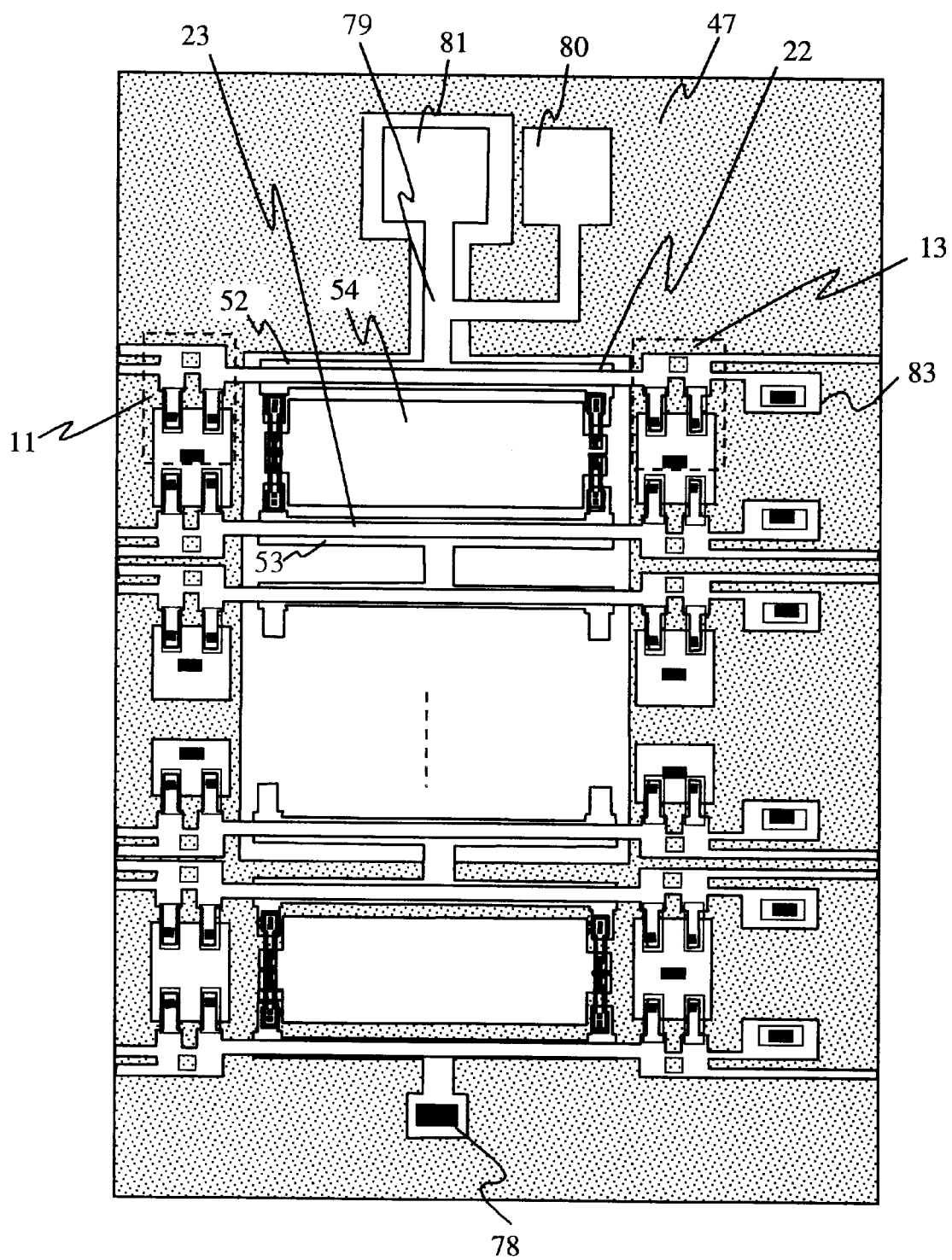
FIG. 21 is a schematic diagram showing a SQUID array circuit layout of a superconductor signal amplifier in a tenth preferred embodiment.

Referring to FIG. 21, there is shown a schematic diagram of a SQUID array circuit layout of a superconductor signal amplifier in embodiment X. In FIG. 21, the uppermost and lowermost parts of the superconductor signal amplifier (corresponding to those shown in FIG. 8) are shown while the intermediate parts are omitted. The members identical to those in FIGS. 8 to 11 are accorded the same reference numerals in FIG. 21. Further, for the sake of simplicity, the insulating layers are not shown so that the essential connection relationships can be identified with ease. As to SQUIDs, reference numerals 52 and 53 indicate input inductors, and reference numerals 22 and 23 indicate control line for applying magnetic fields. As to Josephson transmission lines, the same reference numerals as those in embodiment VIII are assigned.

As can be seen from comparison between FIGS. 21 and 19, embodiment X differs from embodiment VIII only in that a part of an inductor is shared by two SQUIDs in a pair. In Josephson transmission lines 11 and 12 in FIG. 21, Josephson junctions are illustrated differently from those in FIG. 19, for the purpose of presenting a simplified scheme of the Josephson junctions of the Josephson transmission lines 11 and 12 which are detailed in FIG. 11.

Embodiment XI

Figure 22:
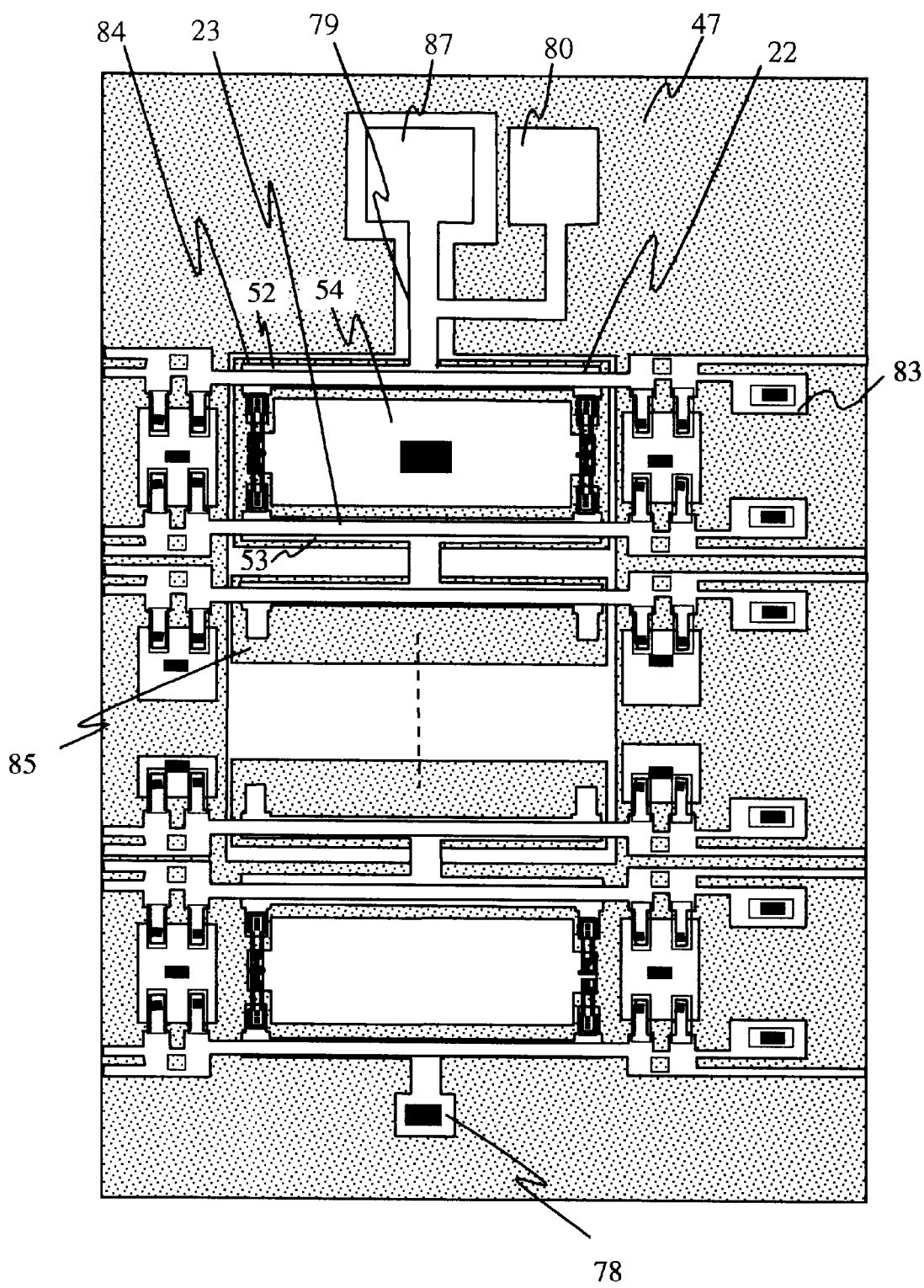
FIG. 22 is a schematic diagram showing a SQUID array circuit layout of a superconductor signal amplifier in an eleventh preferred embodiment.

Referring to FIG. 22, there is shown a schematic diagram of a SQUID array circuit layout of a superconductor signal amplifier in embodiment XI. A difference between FIGS. 22 and 21 is similar to that between FIGS. 20 and 19. That is, embodiment XI differs from embodiment X only in that a magnetic shielding film is formed isolatedly for each pair of SQUIDs.

Other Embodiments

In each of the foregoing embodiments, there are provided 16 SQUIDs as described with reference to the accompanying drawings. Even in a modified arrangement in which 32 SQUIDs are provided to attain higher degree of amplification, a decrease hardly occurs in signal frequency. Since a control line for applying magnetic field is just magnetically coupled with each SQUID, an increase in the number of SQUIDs does not result in an increase in the inductance of the control line for applying magnetic field. Note, however, that an increase in the number of SQUIDs results in an increase in the area occupied by the superconductor signal amplifier, giving rise to disadvantages such as dimensional restriction on logic circuits and difficulty in layout of circuit elements on a chip.

As set forth hereinabove and according to the present invention, it is possible to perform voltage/current amplification of a high-frequency signal of tens of GHz without a decrease in frequency and also amplify a signal having an arbitrary frequency without an increase in rise/fall time in a waveform thereof.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A superconducting quantum interference device, fabricated on one surface of a substrate, comprising:

a first Josephson junction pair made of two Josephson junctions;

first and second inductive elements connected to the first Josephson junction pair in a loop configuration to form a first superconductive loop;

a second Josephson junction pair made of two Josephson junctions connected in a loop configuration sharing a part of the second inductive element to form a second superconductive loop;

a third inductive element connected to the second Josephson junction pair in the loop configuration of the second superconductive loop; and an input circuit magnetically coupled with the first and third inductive elements.

2. A superconducting quantum interference device as claimed in claim 1, wherein each of the first and third inductive elements is divided into two parts.

3. A superconducting quantum interference device as claimed in claim 2, wherein the divided two parts are connected to a direct current power source or ground.

4. A superconductive circuit including a superconducting quantum interference device fabricated on one surface of a substrate, comprising:

a first Josephson transmission line, including an inductive element having an input terminal for signal input and an output terminal for signal output, Josephson junctions respectively connected to the input and output terminals of the inductive element, and direct current sources respectively connected to the input and output terminals of the inductive element;

a second Josephson transmission line which is identical in structure to the first Josephson transmission line;

a first inductive element connected between an input terminal of the second Josephson transmission line and an output terminal of the first Josephson transmission line;

a second inductive element magnetically coupled with the first inductive element;

a Josephson junction pair made of two Josephson junctions, wherein the Josephson junction pair is connected to the second inductive element in a loop configuration to form a first superconductive loop; and a resistor element connected to an output terminal of the second Josephson transmission line.

5. A superconductive circuit, wherein a first Josephson transmission line and a second Josephson transmission line which is identical in structure to the first Josephson transmission line are provided respectively at an input terminal for signal input and an output terminal for signal output in an input circuit as claimed in claim 1.

6. A superconductive circuit, wherein a first Josephson transmission line and a second Josephson transmission line which is identical in structure to the first Josephson transmission line are provided respectively at an input terminal for signal input and an output terminal for signal output in an input circuit as claimed in claim 2.

7. A superconductive circuit, wherein a first Josephson transmission line and a second Josephson transmission line which is identical in structure to the first Josephson transmission line are provided respectively at an input terminal for signal input and an output terminal for signal output in an input circuit as claimed in claim 3.

8. A superconductive circuit including a superconducting quantum interference device fabricated on one surface of a substrate, comprising:

a magnetic shielding film formed on the substrate;

a first insulating film for electrical insulation on the magnetic shielding film;

a first superconductive thin film formed on the first insulating film;

a second insulating film formed on the first superconductive thin film;

a second superconductive thin film formed on the second insulating film;

a first Josephson junction pair made of two Josephson junctions formed by connecting the first superconductive thin film with the second superconductive thin film so that a first superconductive loop including first and second inductive elements are formed;

a second Josephson junction pair made of two Josephson junctions formed by connecting the first superconductive thin film with the second superconductive thin film so that a second superconductive loop including the second inductive element and a third inductive element are formed, such that said first and second superconductive loops share said second inductive element; and an input circuit magnetically coupled with the first and third inductive elements.

9. A superconductive circuit device comprising:

a superconductive circuit including a superconducting quantum interference device fabricated on one surface of a substrate, a magnetic shielding film formed on the substrate, a first insulating film for electrical insulation on the magnetic shielding film, a first superconductive thin film formed on the first insulating film, a second insulating film formed on the first superconductive thin film, a second superconductive thin film formed on the second insulating film, and a Josephson junction formed by connecting the first superconductive thin film with the second superconductive thin film; and two superconductive thin films magnetically coupled with the superconductive circuit.

10. A superconductive circuit device as claimed in claim 9, wherein the two superconductive thin films are formed in a layer corresponding to the first or second superconductive thin film.

11. A superconductive circuit device comprising:

a plurality of superconductive circuits each including a superconducting quantum interference device fabricated on one surface of a substrate, a magnetic shielding film formed on the substrate, a first insulating film for electrical insulation on the magnetic shielding film, a first superconductive thin film formed on the first insulating film, a second insulating film formed on the first superconductive thin film, a second superconductive thin film formed on the second insulating film, and a Josephson junction formed by connecting the first superconductive thin film with the second superconductive thin film; and two superconductive thin films magnetically coupled with the plural superconductive circuits respectively;

wherein the magnetic shielding film is patterned to provide isolation for each of the plural superconductive circuits.

12. A superconductive circuit device as claimed in claim 11, wherein the first and second superconductive thin films are formed of an oxide superconductive material.

13. A superconductive circuit device including a superconducting quantum interference device fabricated on one surface of a substrate, comprising:

a first Josephson transmission line including a first Josephson junction pair made of two Josephson junctions, first and second inductive elements connected to the first Josephson junction pair in a loop configuration to form a first superconductive loop, a second Josephson junction pair made of two Josephson junctions connected in a loop configuration sharing the first inductive element to form a second superconductive loop, a third inductive element connected to the second Josephson junction pair in the loop configuration of the second superconductive loop, an inductive element having an input terminal for signal input and an output terminal for signal output, Josephson junctions respectively connected to the input and output terminals of the inductive element and direct current sources respectively connected to the input and output terminals of the inductive element;

a second Josephson transmission line which is identical in structure to the first Josephson transmission line;

a fourth inductive element which is connected to an input terminal of the first Josephson transmission line and magnetically coupled with the second inductive element;

a fifth inductive element which is connected to an input terminal of the second Josephson transmission line and magnetically coupled with the third inductive element;

a first terminal resistor disposed at an output terminal of the first Josephson transmission line; and a second terminal resistor disposed at an output terminal of the second Josephson transmission line.

14. A superconductive circuit including a superconducting quantum interference device fabricated on one surface of a substrate, comprising:

a first Josephson transmission line including a first Josephson junction pair made of two Josephson junctions, first and second inductive elements connected to the first Josephson junction pair in a loop configuration to form a first superconductive loop, a second Josephson junction pair made of two Josephson junctions connected in a loop configuration sharing the first inductive element to form a second superconductive loop, a third inductive element connected to the second Josephson junction pair in the loop configuration of the second superconductive loop, an inductive element having an input terminal for signal input and an output terminal for signal output, Josephson junctions respectively connected to the input and output terminals of the inductive element, and direct current sources respectively connected to the input and output terminals of the inductive element;

a second Josephson transmission line which is identical in structure to the first Josephson transmission line;

a fourth inductive element which is connected to an output terminal of the first Josephson transmission line and magnetically coupled with the second inductive element;

a fifth inductive element which is connected to an output terminal of the second Josephson transmission line and magnetically coupled with the third inductive element;

a sixth inductive element connected to an input terminal of the first Josephson transmission line;

a seventh inductive element connected to an input terminal of the second Josephson transmission line; and a signal input terminal connected to a terminal of the sixth inductive element and to a terminal of the seventh inductive element.

15. A superconductor signal amplifier circuit comprising:

an array of plural series-connected superconducting quantum interference devices, each fabricated on one surface of a substrate, and each including a Josephson junction pair made of two Josephson junctions which are connected in a loop configuration to form a superconductive loop;

a splitter for receiving a flux quantum signal and delivering two flux quantum signals;

a circuit for generating a plurality of flux quantum signal according to the number of the plural series-connected superconducting quantum interference devices in the array; and an input circuit for simultaneously inputting each of the produced flux quantum signals as a control signal to a control line for applying the magnetic field of each superconducting quantum interference device;

wherein the plural superconducting quantum interference devices are switched to a voltage state by the flux quantum signals.

16. A superconductor signal amplifier circuit as claimed in claim 15, wherein the circuit for generating a plurality of flux quantum signals is arranged in a fashion that a plurality of splitters are disposed at a plurality of cascaded stages, wherein a flux quantum signal output from each of the splitters is input to a splitter of a succeeding stage, and wherein adjacent splitters are connected through a Josephson transmission line comprising at least two Josephson junctions connected in parallel using superconductive wiring so that the plural flux quantum signals propagate to the superconducting quantum interference devices in the same period of time.

17. A superconductor signal amplifier circuit as claimed in claim 15, wherein the control line for applying the magnetic field of each superconducting quantum interference device is terminated through a Josephson transmission line.

18. A superconductive circuit device comprising:

a plurality of superconductive circuits each including a superconducting quantum interference device fabricated on one surface of a substrate, a magnetic shielding film formed on the substrate, a first insulating film on the magnetic shielding film, a first superconductive thin film formed on the first insulating film, a second insulating film formed on the first superconductive thin film, a second superconductive thin film formed on the second insulating film, and a Joseph on junction formed by connecting the first superconductive thin film with the second superconductive thin film;

wherein the magnetic shielding film has a cutout area for the first insulating film or the second insulating film, wherein a connection point is provided for connection between the magnetic shielding film and the first or second superconductive thin film, and wherein the magnetic shielding film is patterned to provide isolation for each of the plural superconductive circuits.

\* \* \* \* \*